US012580596B2

(12) United States Patent
Jang et al.

(10) Patent No.: US 12,580,596 B2
(45) Date of Patent: Mar. 17, 2026

(54) APPARATUS FOR RECEIVING DIFFERENTIAL SIGNAL, METHOD THEREFOR, AND COMMUNICATION METHOD INCLUDING THE SAME

(71) Applicant: SAMSUNG ELECTRONICS CO., LTD., Suwon-si (KR)

(72) Inventors: Horang Jang, Suwon-si (KR); Beomwoo Lee, Suwon-si (KR); Soomin Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 273 days.

(21) Appl. No.: 18/241,963

(22) Filed: Sep. 4, 2023

(65) Prior Publication Data

US 2024/0088922 A1 Mar. 14, 2024

(30) Foreign Application Priority Data

Sep. 13, 2022 (KR) ........................ 10-2022-0115198

(51) Int. Cl.
*H04B 7/24* (2006.01)
*H03F 3/45* (2006.01)
*H04B 1/00* (2006.01)

(52) U.S. Cl.
CPC ....... *H04B 1/0078* (2013.01); *H03F 3/45071* (2013.01)

(58) Field of Classification Search
CPC .......... H04B 1/02; H04B 1/04; H04B 1/0483; H04B 1/06; H04B 1/16; H04B 1/0078; H03F 3/45; H03F 3/181; H03F 3/189
See application file for complete search history.

(56) References Cited

U.S. PATENT DOCUMENTS

| | | | |
|---|---|---|---|
| 7,590,025 B2 | 9/2009 | Wang et al. | |
| 7,639,745 B2 | 12/2009 | Bonelli et al. | |
| 8,045,626 B2 | 10/2011 | Iwasaki | |
| 9,166,835 B2 * | 10/2015 | Xu | H04L 25/03885 |
| 10,514,747 B2 * | 12/2019 | Fernald | G06F 1/3234 |
| 10,572,406 B2 | 2/2020 | Oh et al. | |
| 11,063,737 B2 | 7/2021 | Takahashi | |
| 2013/0007489 A1 * | 1/2013 | Unnikrishnan | G06F 13/4282 |
| | | | 713/320 |

FOREIGN PATENT DOCUMENTS

| | | |
|---|---|---|
| KR | 10-0959846 | 5/2010 |
| KR | 10-1012622 | 2/2011 |
| KR | 10-1470296 | 12/2014 |
| KR | 10-1593083 | 2/2016 |
| KR | 10-2352905 | 1/2022 |

* cited by examiner

*Primary Examiner* — Tuan Pham
(74) *Attorney, Agent, or Firm* — Fish & Richardson P.C.

(57) ABSTRACT

A communication device includes a first device and a second device. The first device includes a transmitting circuit configured to output and transmit a differential signal including a first signal and a second signal to the second device using an input signal and an enable signal. The second device includes a first amplifier configured to receive the differential signal from the first device, a gate circuit configured to gate an output signal of the first amplifier based on a deactivated reset signal, and a count circuit configured to: (1) count a section in which a value of the differential signal is constant based on a clock signal and an output signal of the gate circuit and (2) generate an activated reset signal when the count of the section exceeds a threshold value.

20 Claims, 20 Drawing Sheets

FIG. 4

```
always @(posedge CLOCK or posedge RESET)
begin
  if ( RESET )
          CNT = 0 ;

else
  if ( DATA == 1'b1 )
        CNT = 0 ;
  else  if (CNT <= Th + 1)
    CNT = CNT + 1;
End
```

FIG. 7

```
always @(posedge CLOCK or posedge RESET)
begin
  if ( RESET )
          CNT = 0 ;

else
  if ( DATA == 1'b1 )
        CNT = 0 ;
  else  if (CNT_EN == 1'b1 && CNT <= Th + 1)
    CNT = CNT + 1;
End
```

FIG. 13

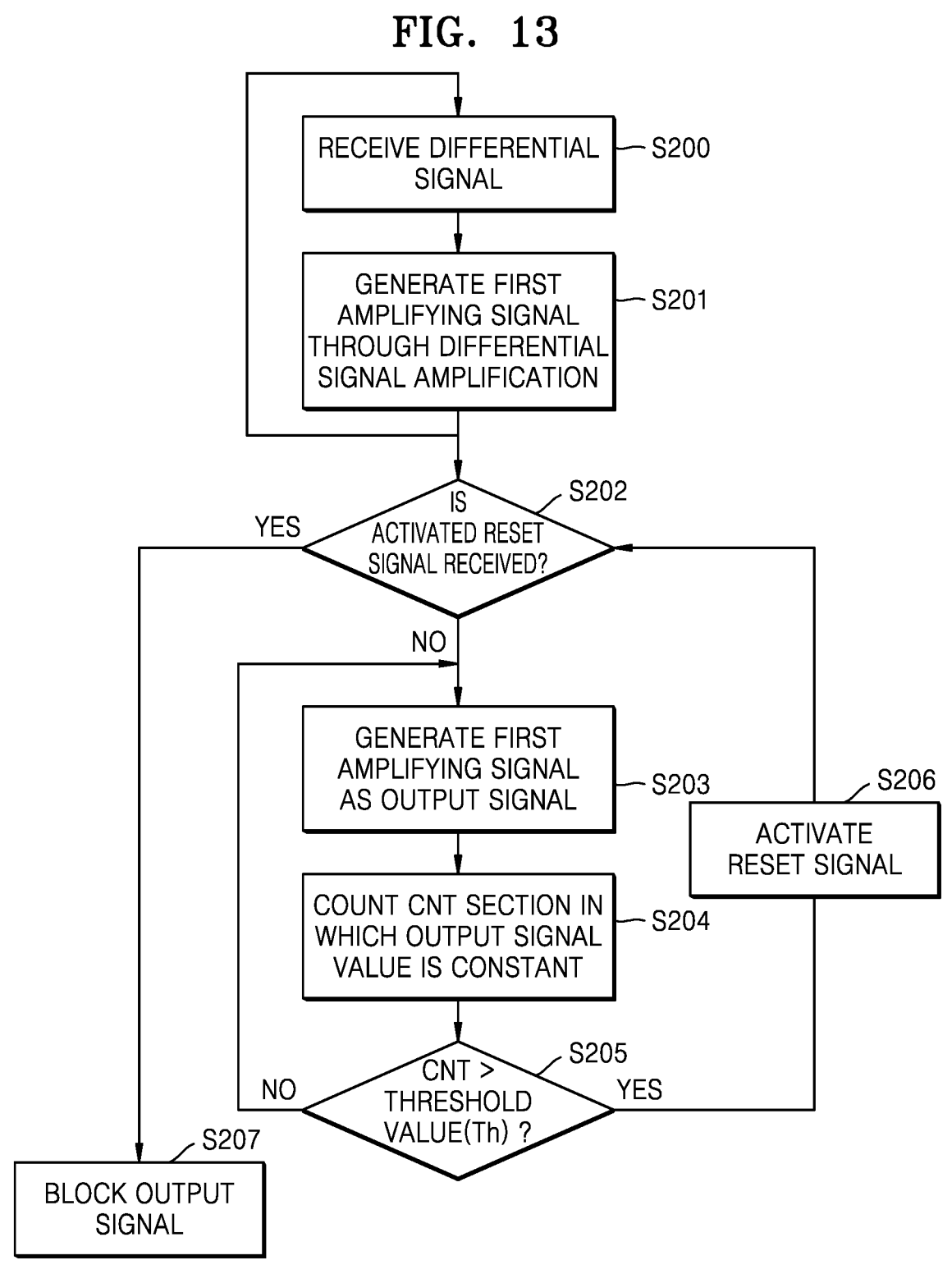

RECEIVE DIFFERENTIAL SIGNAL — S200

GENERATE FIRST AMPLIFYING SIGNAL THROUGH DIFFERENTIAL SIGNAL AMPLIFICATION — S201

IS ACTIVATED RESET SIGNAL RECEIVED? — S202

YES

NO

GENERATE FIRST AMPLIFYING SIGNAL AS OUTPUT SIGNAL — S203

ACTIVATE RESET SIGNAL — S206

COUNT CNT SECTION IN WHICH OUTPUT SIGNAL VALUE IS CONSTANT — S204

CNT > THRESHOLD VALUE(Th) ? — S205

NO

YES

BLOCK OUTPUT SIGNAL — S207

APPARATUS FOR RECEIVING DIFFERENTIAL SIGNAL, METHOD THEREFOR, AND COMMUNICATION METHOD INCLUDING THE SAME

CROSS-REFERENCE TO RELATED APPLICATION

This application is based on and claims priority under 35 U.S.C. § 119 to Korean Patent Application No. 10-2022-0115198, filed on Sep. 13, 2022, in the Korean Intellectual Property Office, the disclosure of which is incorporated by reference herein in its entirety.

BACKGROUND

The disclosure relates to a signal receiving apparatus and a signal receiving method and, more specifically, to a differential signal receiving apparatus and a method of receiving a differential signal.

A receiving device of a communication device may receive and process a differential signal used in its operation. For example, differential signaling may be used in high-speed communication interfaces. However, even when a valid signal is not received, if current flows through the resistor of the receiving device, power consumption may increase and malfunction of the device may occur. Therefore, to deal with this problem, a method of controlling the operation of a receiving device by distinguishing between when data is transmitted and when not transmitted has been proposed.

SUMMARY

The disclosure provides a receiving device and method capable of preventing malfunction and reducing or minimizing power consumption.

According to an aspect of the disclosure, there is provided a device including a first device and a second device. The first device includes a transmitting circuit configured to output and transmit a differential signal including a first signal and a second signal to the second device using an input signal and an enable signal. The second device includes: (1) a first amplifier configured to receive the differential signal from the first device, (2) a gate circuit configured to gate an output signal of the first amplifier based on a reset signal, and (3) a count circuit configured to count a section in which a value of the differential signal is constant based on a clock signal and an output signal of the gate circuit and to generate the reset signal activated when the section exceeds a threshold value.

According to another aspect of the disclosure, there is provided a method of communicating with a first device. The method includes receiving a differential signal including a first signal and a second signal, generating a first output signal by amplifying the differential signal, generating a second output signal by gating the first output signal based on a reset signal, counting sections in which the value of the differential signal is constant, based on the second output signal, and activating the reset signal when the section exceeds a threshold value.

According to another aspect of the disclosure, there is provided a method of communication between a first device and a second device. The method includes transmitting, by the first device, a differential signal including a first signal and a second signal to the second device; counting, by the second device, a section in which a value of the differential signal is kept constant; and ignoring, by the second device, the value of the differential signal when the section exceeds a threshold value. The transmitting of the differential signal includes transmitting the differential signal having a constant value during an idle section to the second device and entering a low power mode after the idle section.

BRIEF DESCRIPTION OF THE DRAWINGS

Embodiments of the disclosure will be more clearly understood from the following detailed description taken in conjunction with the accompanying drawings in which:

FIG. 4 is code illustrating a method of operating a counter according to an embodiment of the present disclosure;

FIG. 7 is code illustrating a method of operating a counter according to another embodiment of the present disclosure;

FIG. 13 is a flowchart illustrating a method of blocking output in a communication method according to an embodiment of the present disclosure;

DETAILED DESCRIPTION OF THE EMBODIMENTS

Hereinafter, embodiments of the present disclosure will be described in detail with reference to the accompanying drawings.

Figure 1:
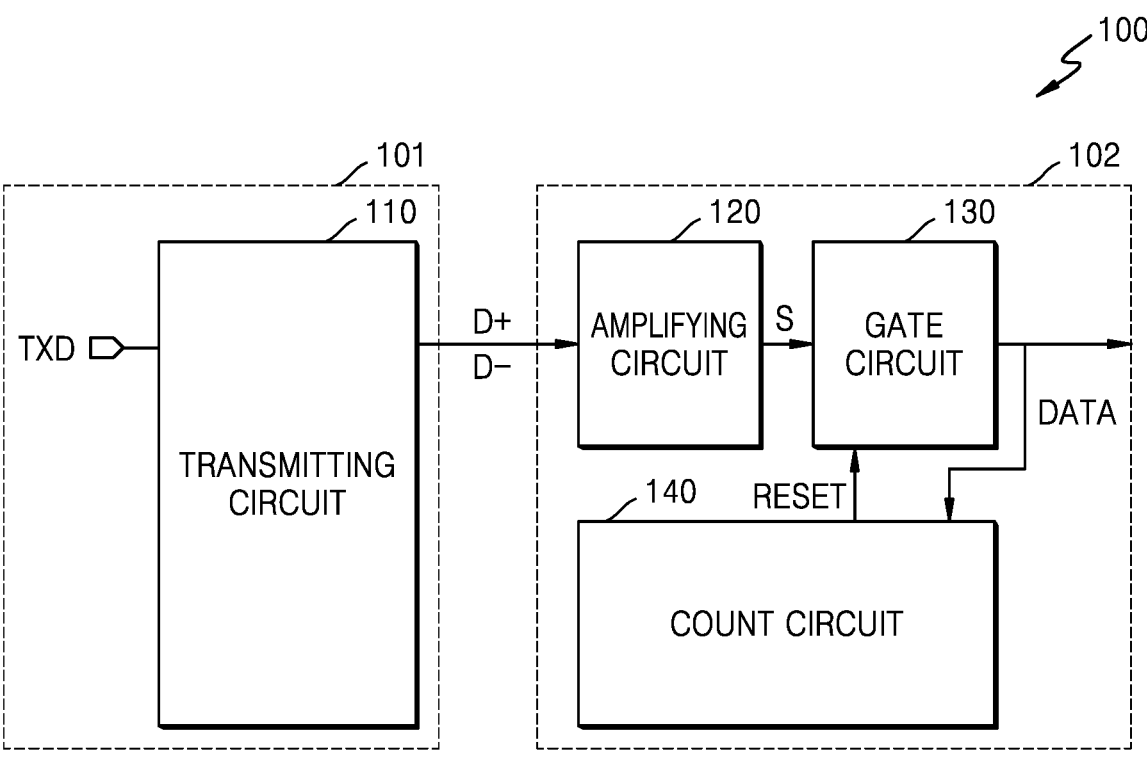
FIG. 1 is a block diagram illustrating a system including a receiving device according to an embodiment of the present disclosure.

FIG. 1 is a block diagram illustrating a communication system including a receiving device according to an embodiment of the present disclosure.

A communication system 100 may perform a signal (e.g., data) transmission/reception function between a plurality of devices, generate a clock signal using a differential signal received by a receiving device 102, and perform various internal functions of the device based on the differential signal and the generated clock signal. Alternatively, the receiving device 102 of the communication system 100 may receive data using the received differential signal. For example, the communication system 100 may be a system applied to a chip interface for transmitting and receiving various signals.

Referring to FIG. 1, the communication system 100 may include a transmitting device 101 and the receiving device 102. The transmitting device 101 may include a transmitting circuit 110 for receiving and transmitting an input signal TXD to the receiving device 102, and the receiving device 102 may include an amplifying circuit 120, a gate circuit 130, and a count circuit 140.

In some embodiments, the transmitting device 101 generates a differential signal composed of the first signal D+ and the second signal D− through the transmitting circuit 110, according to the input signal TXD, and transmits the generated differential signal to the receiving device 102. As described later, the first signal D+ and the second signal D− may be generated as signals having complementary levels or signals having the same level according to the input signal TXD and the transmitting circuit 110.

In some embodiments, the amplifying circuit 120 may receive the first signal D+ and the second signal D− from the transmitting device 101 (i.e., receive a differential signal). The received differential signal may be generated as an amplifying signal S through the amplifying circuit 120 and transmitted to the gate circuit 130 as described later. In some embodiments, the amplifying signal S may include a first amplifying signal S1 and/or a second amplifying signal S2, as described later with reference to FIGS. 2 and 5.

In some embodiments, the gate circuit 130 may receive an amplifying signal S that is an output of the amplifying circuit 120 and, as described later, output or block an output signal DATA through a gating operation based on a reset signal RESET of the count circuit 140. For example, when receiving a deactivated reset signal RESET, the gate circuit 130 may produce an output signal DATA based on an amplifying signal S obtained by amplifying a differential signal composed of the first signal D+ and the second signal D−, and when receiving the activated reset signal RESET, the gate circuit 130 may block the amplifying signal S from being produced as the output signal DATA. In addition, the gate circuit 130 may transmit the output signal DATA based on the amplifying signal S to the count circuit 140.

In some embodiments, the count circuit 140 may perform a count operation by receiving the output signal DATA from the gate circuit 130. Specifically, the count circuit 140 may receive, from the gate circuit 130, the output signal DATA based on the differential signal. As described later, the count circuit 140 may determine whether or not transmission of the input signal TXD is completed by counting a section in which the value of the output signal DATA is constant. Also, the count circuit 140 may generate a reset signal RESET according to the result of the count operation. The reset signal RESET may be transmitted to the gate circuit 130, and the gate circuit 130 may gate the output of the amplifying signal S as the output signal DATA according to whether the reset signal RESET is activated. Also, the count circuit 140 may receive the generated reset signal RESET and control a counting operation according to whether the reset signal RESET is activated.

As a result, the receiving device 102 may receive a differential signal composed of the first signal D+ and the second signal D−, gate the output of the amplifying signal S as the output signal DATA according to the interaction between the gate circuit 130 and the count circuit 140, and control the count operation. Through this, the receiving device 102 may prevent the transfer of erroneous data through amplification even if there is an effect of noise or a small signal difference in the process of amplifying the signal when signal transmission is completed through the above gating operation. In addition, since the receiving device 102 determines whether the transmission of the signal has been completed through a count operation, without complicated calculations or increased design difficulty, to figure out what period of time the signal is transmitted, the receiving device 102 may be widely applied to various environments and devices and may further reduce circuit overhead.

Figure 2:
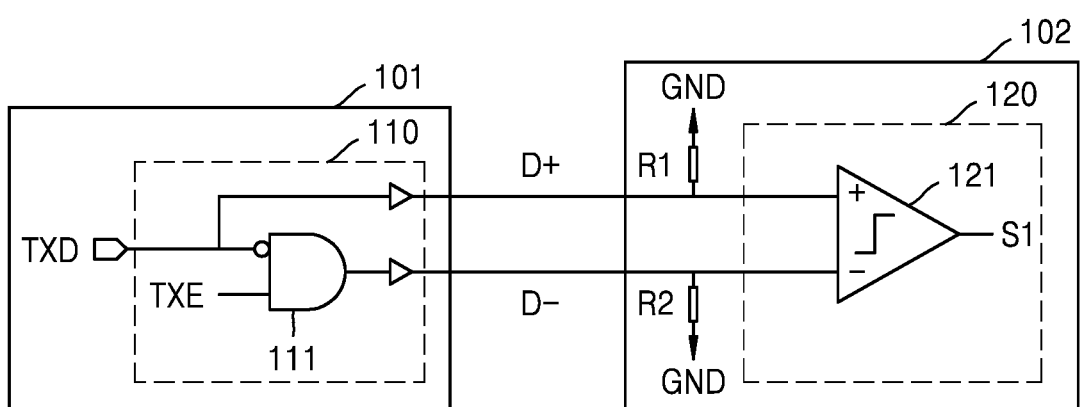
FIG. 2 is a circuit diagram illustrating a portion of a communication system according to an embodiment of the present disclosure.

FIG. 2 is a circuit diagram illustrating part of a communication system according to an embodiment of the present disclosure.

Referring to FIGS. 1 and 2, the transmitting circuit 110 included in the transmitting device 101 may include a first logic gate 111. The transmitting circuit 110 may generate a first signal D+ and a second signal D− constituting a differential signal using an input signal TXD and a TX enable signal TXE and transmit the generated first and second signals D+ and D− to the receiving device 102. Also, in some embodiments, the receiving device 102 may include a resistor R1 connecting the first signal D+ to ground and a resistor R2 connecting the second signal D− to ground and the amplifying circuit 120 may include a first amplifier 121. A voltage generated by the current flowing through the resistors R1 and R2 may be received by the amplifying circuit 120. The first amplifier 121 may output a first amplifying signal S1 by amplifying the differential signal.

In some embodiments, the first logic gate 111 may receive the input signal TXD and the TX enable signal TXE. When the transmitting device 101 intends to transmit data, the transmitting circuit 110 may set the TX enable signal TXE to a logic high level. That is, the transmitting circuit 110 may configure and transmit the first signal D+ and the second signal D− to have different logic levels from each other by setting the TX enable signal TXE to a logic high level.

Also, in some embodiments, the transmitting device 101 may set the input signal TXD to a logic low level to prevent malfunction when the transmitting device 101 does not transmit data. At this time, to enter the low power mode, the transmitting device 101 sets the TX enable signal TXE to a logic low level, thereby setting both the first signal D+ and the second signal D− to a logic low level. Therefore, the transmitting device 101 may prevent current from flowing through the resistors R1 and R2 of the receiving device 102, thereby greatly reducing power consumption. Also, as an example, the transmitting device 101 may enter the low power mode after a sufficient idle section when transmission of the input signal TXD is completed, as described later.

Figure 3:
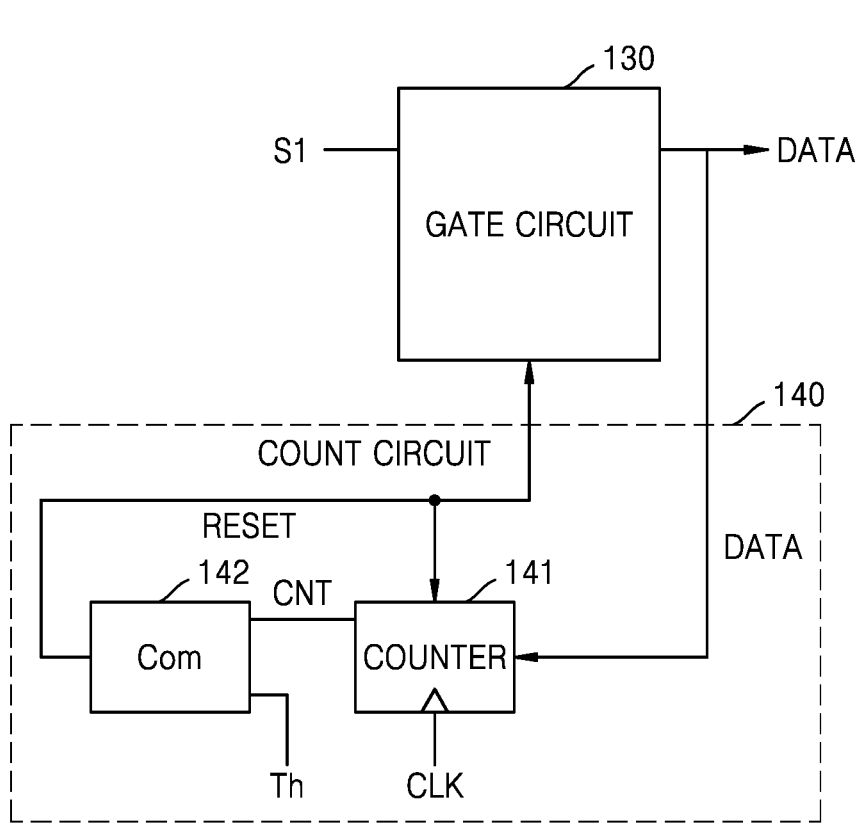
FIG. 3 is a circuit diagram showing a part of a receiving device according to an embodiment of the present disclosure.

FIG. 3 is a circuit diagram showing a part of a receiving device according to an embodiment of the present disclosure.

Referring to FIGS. 1 to 3, in some embodiments, the count circuit 140 may include a first counter 141 and a first comparator 142. The gate circuit 130 may gate the received first amplifying signal S1, which is an output of the amplifying circuit 120, based on the reset signal RESET of the count circuit 140. The count circuit 140 may receive the output signal DATA of the gate circuit 130. The first counter 141 may count a section having a constant value of the output signal DATA according to the counter clock CLK and output the count value CNT. The first comparator 142 may compare the count value CNT, which is an output of the first counter 141, with the threshold value Th and output a reset signal RESET. For example, the first comparator 142 may output an activated reset signal RESET when the count value CNT exceeds the threshold value Th and may output a deactivated reset signal RESET when the count value CNT is less than or equal to the threshold value Th. The reset signal RESET may be transmitted to each of the first counter 141 and the gate circuit 130. The first counter 141 may reset the count value CNT (e.g., reset to 0) when receiving an activated reset signal RESET and continue to perform a count operation without a reset operation when receiving a deactivated reset signal RESET.

The gate circuit 130 may output the first amplifying signal S1 as an output signal DATA when receiving the deactivated reset signal RESET and produce an output signal DATA having a constant value independent of the first amplifying signal S1 when receiving the activated reset signal RESET. That is, the gate circuit 130 and the count circuit 140 may gate the output signal DATA and perform a count operation through a mutual operation based on the count value CNT.

FIG. 4 is code illustrating a method of operating a counter according to an embodiment of the present disclosure.

Referring to FIGS. 3 and 4, in some embodiments, the first counter 141 may count a section in which the output signal DATA has a constant logic low level. For example, the first counter 141 may perform a count operation according to the positive edge of the counter clock CLK or the positive edge of the reset signal RESET. For example, when the first counter 141 detects a positive edge of the reset signal RESET (e.g., when an activated reset signal RESET is received), the count value CNT may be reset to 0. When receiving the deactivated reset signal RESET, the first counter 141 may perform a counting operation according to the positive edge of the counter clock CLK. In this case, the first counter 141 may reset the count value CNT to 0 when the value of the output signal DATA is 1 (i.e., a logic high level). On the other hand, the first counter 141 may increase the count value CNT by 1 when the value of the output signal DATA is 0 (i.e., at a logic low level). However, the disclosure is not limited to this embodiment. For example, the count circuit 140 may also count a section in which the output signal DATA has a constant logic high level.

In some embodiments, when transmission of the input signal TXD is completed as described above, a section in which the first signal D+ and the second signal D− are constant, that is, a section in which the differential signal is kept constant (e.g., an idle section), may exist. For example, when the signal transmission is completed, the idle section starts and the first signal D+ may be maintained at a logic low level and the second signal D− may be maintained at a logic high level and, accordingly, the value of the output signal DATA may be maintained constant at a logic low level.

That is, the count circuit 140 counts sections in which the value of the output signal DATA is constant at the logic low level during the idle section through the first counter 141 and outputs an activated reset signal RESET when the count value CNT exceeds the threshold value Th, so that an operation of blocking the gate circuit 130 from outputting the first amplifying signal S1 as the output signal DATA and resetting the first counter 141 may be performed.

As a result, the receiving device 102 may accurately detect the completion of data transmission (e.g., the idle section) without complicated design or calculation. In addition, since the receiving device 102 blocks the output of the output signal DATA through accurate detection of data transmission, it is possible to prevent malfunction due to an error in the output signal DATA due to the influence of noise, etc. And, as described above, the transmitting device 101 may greatly reduce power consumption through an idle section and low power mode entry. In addition, since the receiving device 102 may determine the data transmission state through a digital signal rather than an analog signal, the receiving device 102 may accurately determine whether data transmission has been completed.

Figure 5:
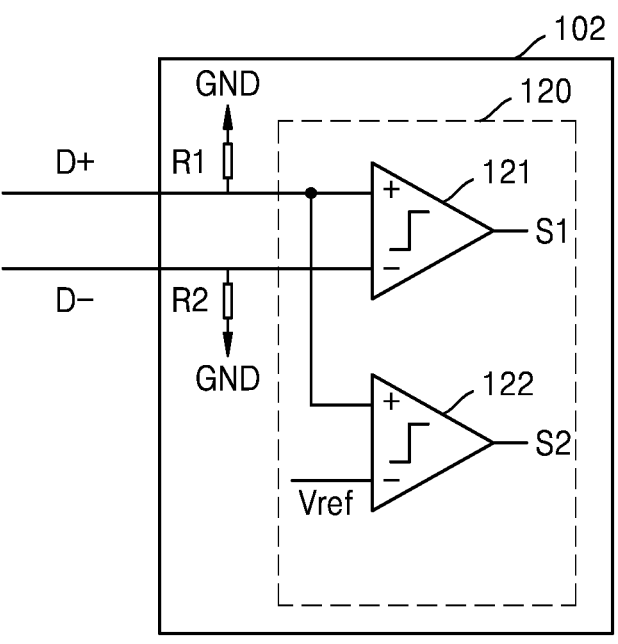
FIGS. 5 and 6 are circuit diagrams illustrating implementation examples of configurations of receiving devices according to embodiments of the present disclosure.
Figure 6:
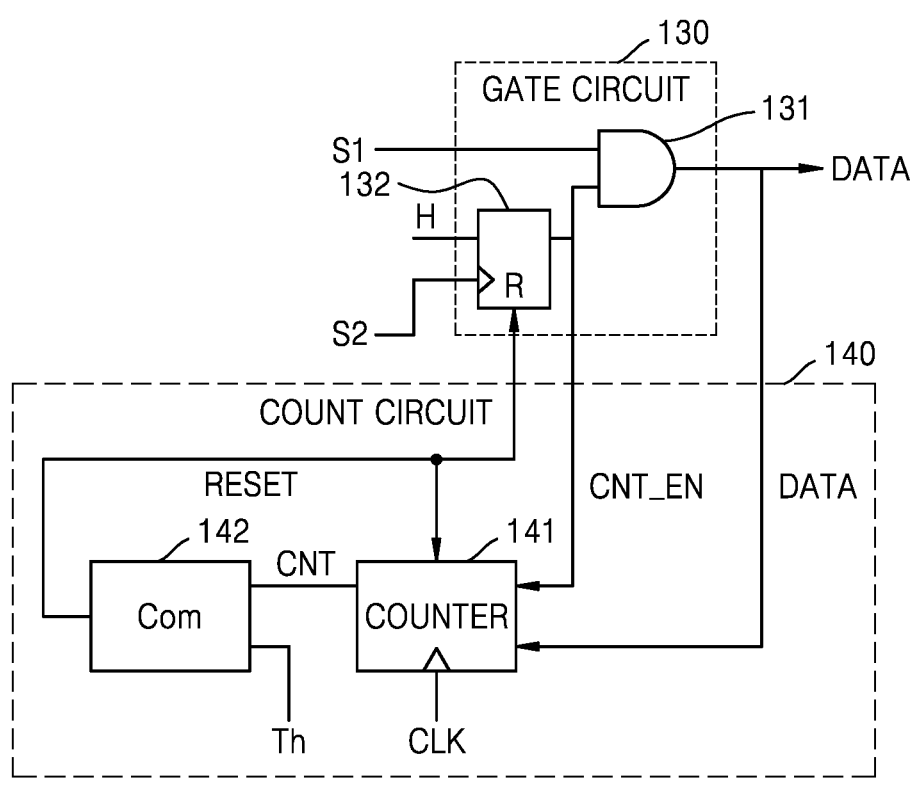

FIGS. 5 and 6 are circuit diagrams illustrating implementation examples of configurations of receiving devices according to embodiments of the present disclosure.

Referring to FIGS. 2, 5, and 6, in some embodiments the amplifying circuit 120 of the receiving device 102 may further include a second amplifier 122. The second amplifier 122 may receive any one of the first signal D+ and the second signal D− and the reference voltage Vref and output the second amplifying signal S2. Hereinafter, for convenience of explanation, it is assumed that the second amplifier 122 receives the first signal D+ and the reference voltage Vref as shown in the drawing. The reference voltage Vref may have a level between a logic low level and a logic high level. For example, the reference voltage Vref may have a level intermediate between a logic low level and a logic high level. For example, as described above, as the first signal D+ and the second signal D− have the same logic level (e.g., logic low level) in the low power mode section, a differential signal may be in a state in which differential characteristics are lost. Therefore, according to the comparison result between the first signal D+ having a logic low level and the reference voltage Vref in the low power mode section, the second amplifier 122 may output a second amplifying signal S2 having a logic low level. At this time, as an example, the second signal D− may be maintained at a logic high level and the first signal D+ may be changed to a logic high level. Accordingly, the second amplifying signal S2 output from the second amplifier 122 may also change to a logic high level.

In some embodiments, the gate circuit 130 may include a flip-flop 132 and a second logic gate 131. The flip-flop 132 may receive the logic high level signal H and the second amplifying signal S2 that is an output of the second amplifier 122 and output the count enable signal CNT_EN. Specifically, for example, as described above, according to the comparison result between the first signal D+ and the reference voltage Vref, the second amplifier 122 may output a second amplifying signal S2 that changes from a logic low level to a logic high level. At this time, the flip-flop 132 may output a logic high level signal H according to the second amplifying signal S2 that is changed to a logic high level. That is, the flip-flop 132 may detect the fluctuating second amplifying signal S2 and output the count enable signal CNT_EN having a logic high level. The count enable signal CNT_EN may be transmitted to the first counter 141 of the count circuit 140. Accordingly, the first counter 141 may perform a count operation in response to the activated count enable signal CNT_EN having a logic high level, as described later.

In addition, the flip-flop 132 may receive the reset signal RESET, which is an output of the first comparator 142 of the count circuit 140. For example, as described above, when the value of the output signal DATA is maintained for a certain section and the count value CNT exceeds the threshold value Th, the first comparator 142 may output an activated reset signal RESET. At this time, when the flip-flop 132 receives the activated reset signal RESET, the flip-flop 132 is reset and outputs a deactivated count enable signal CNT_EN having a logic low level. Accordingly, the first counter 141 may stop the counting operation based on the count enable signal CNT_EN having a logic low level.

In some embodiments, the second logic gate 131 of the gate circuit 130 may receive the first amplifying signal S1 that is the output of the first amplifier 121 based on the count enable signal CNT_EN, which is an output of the flip-flop 132, and the differential signal. As described above, the flip-flop 132 may detect the second amplifying signal S2 and output an activated count enable signal CNT_EN and the second logic gate 131 may generate the output signal DATA through an AND operation of the first amplifying signal S1, which is an amplified differential signal, and the activated count enable signal CNT_EN. That is, the gate circuit 130 may transmit the input signal TXD as an output signal DATA. Also, as described above, the flip-flop 132 may receive an activated reset signal RESET and output an inactivated count enable signal CNT_EN. The second logic gate 131 may block the output of the differential signal amplified through the AND operation of the first amplifying signal S1 and the inactivated count enable signal CNT_EN. That is, the gate circuit 130 may block the output of the input signal TXD. As a result, the count circuit 140 performs a count operation based on the output signal DATA of the gate circuit 130 and the gate circuit 130 may gate the output signal DATA based on the reset signal RESET, according to the count result of the count circuit 140, and determine whether to stop the count circuit 140 by outputting the count enable signal CNT_EN.

As a result, the receiving device 102 may accurately detect whether the input signal TXD is transmitted or not and may control the gating operation and the counting operation through the count enable signal CNT_EN based on this. That is, when the transmission of the input signal TXD is completed, the receiving device 102 may block the output of the output signal DATA and stop the counting operation, and when communication is resumed (that is, when transmission of the input signal TXD starts), the receiving device 102 may accurately detect the communication and resume gating and counting operations.

FIG. 7 is code illustrating a method of operating a counter according to another embodiment of the present disclosure.

Referring to FIGS. 4, 6, and 7, as described above, the first counter 141 may count a section in which the output signal DATA has a constant logic low level. A detailed description of the counting operation of the first counter 141, which is substantially the same as that given above with reference to FIG. 4, will be omitted. In some embodiments, the flip-flop 132 may output the count enable signal CNT_EN based on the reset signal RESET. As described above, the first counter 141 may additionally receive the count enable signal CNT_EN and the first comparator 142 may output a reset signal RESET according to the count result of the first counter 141. For example, the flip-flop 132 may output a count enable signal CNT_EN activated (e.g., having a logic high level) according to the second amplifying signal S2 and transmit the count enable signal CNT_EN to the first counter 141. The first counter 141 may increase the count value CNT by 1 when the output signal DATA has a logic low level based on the received count enable signal CNT_EN.

Alternatively, as described above, the flip-flop 132 may receive the activated reset signal RESET output from the first comparator 142 according to the count result and output a deactivated (e.g., logic low level) count enable signal CNT_EN. The first counter 141 may stop the counting operation based on the received deactivated count enable signal CNT_EN even when the value of the output signal DATA is at a logic low level.

As a result, since the receiving device 102 may accurately detect whether or not the input signal TXD is transmitted and control the operation of the count circuit 140 (for example, stop a count operation when signal transmission is complete) as described above, unnecessary power consumption may be reduced.

Figure 8A:
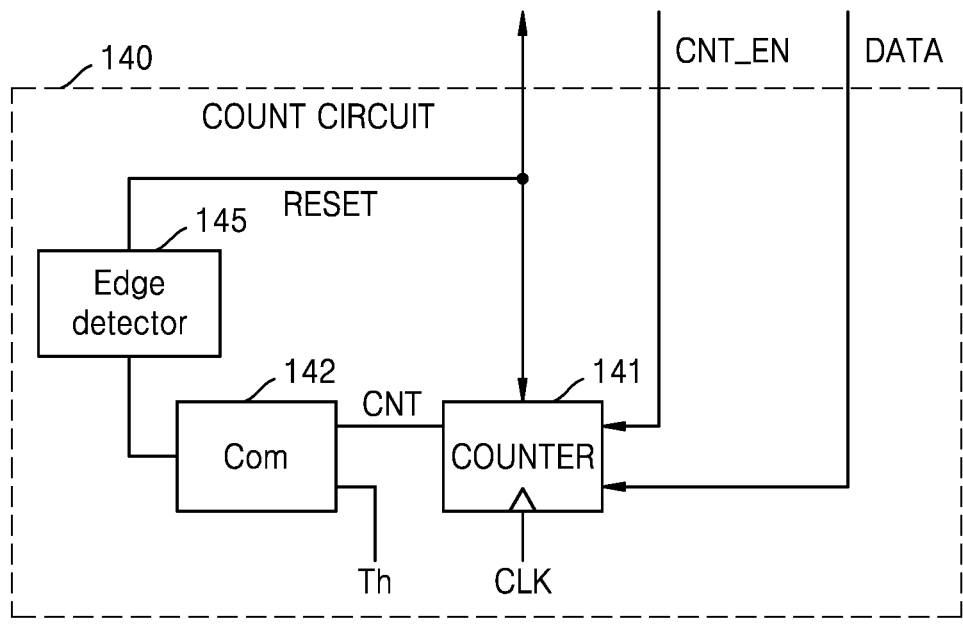
FIGS. 8A to 8C are circuit diagrams illustrating implementation examples of a count circuit according to an embodiment of the present disclosure.
Figure 8B:
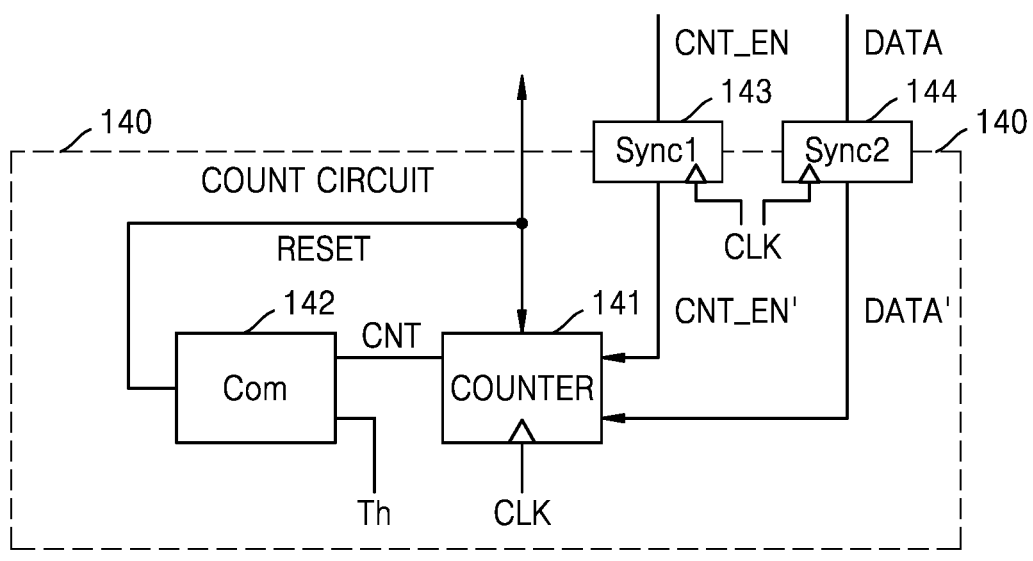
Figure 8C:
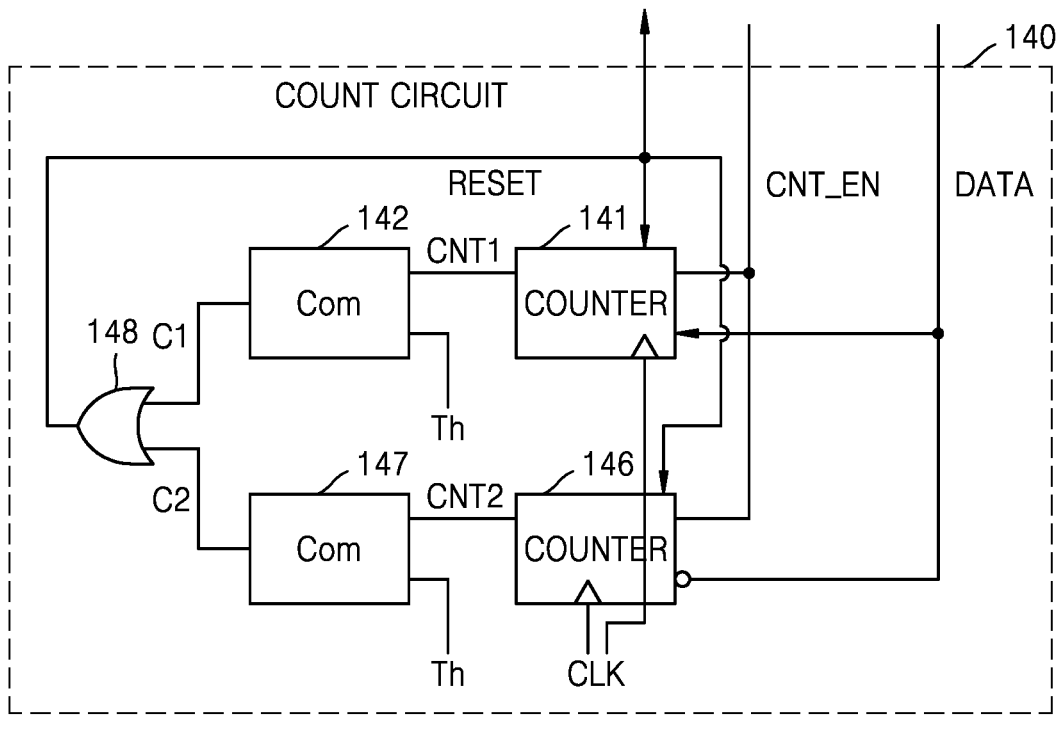

FIGS. 8A to 8C are circuit diagrams illustrating implementation examples of a count circuit according to an embodiment of the present disclosure.

A detailed description of the counting operation of the count circuit 140 that is substantially the same as that given above with reference to FIGS. 3 and 6 will be omitted.

Referring to FIGS. 6 and 8A, in some embodiments the count circuit 140 may further include an edge detector 145. As described above, the first comparator 142 compares the count value CNT output by the first counter 141, by counting a section in which the value of the output signal DATA is constant, to the threshold value Th to output a reset signal RESET. For example, when the count value CNT exceeds the threshold value Th, the first comparator 142 may output an activated (e.g., logic high level) reset signal RESET. In this case, the edge detector 145 may detect the change of the reset signal RESET to a logic high level and generate the reset signal RESET having a pulse waveform. Accordingly, the flip-flop 132 of the gate circuit 130 and the first counter 141 of the count circuit 140 may receive the activated reset signal RESET as a pulse waveform.

As a result, even if entering an idle section or low power section in which the output of the gate circuit 130 is cut off and the operation of the count circuit 140 is stopped based on the reset signal RESET activated due to signal transmission completion, since the reset signal RESET is received as a pulse waveform and deactivated after the pulse section, while signal transmission resumes after an idle section or low power section, the gate circuit 130 and the count circuit 140 may perform the gating and counting operations as described above without additional devices or signals.

Referring to FIGS. 6 and 8B, the count circuit 140 may further include a first synchronizer 143 and a second synchronizer 144. In some embodiments, the first synchronizer 143 and the second synchronizer 144 may include flip-flops connected in series. For example, each of the first synchronizer 143 and the second synchronizer 144 may include flip-flops connected in series with the gate circuit 130.

The first synchronizer 143 and the second synchronizer 144 may receive the count enable signal CNT_EN and the output signal DATA, respectively. The first synchronizer 143 and the second synchronizer 144 may receive the same clock as the counter clock CLK received by the first counter 141 and, accordingly, respectively output a synchronized count enable signal CNT_EN' and a synchronized output signal DATA' according to the counter clock CLK. That is, an area in which the input signal TXD is transmitted and received and output as an output signal DATA and an area in which the count operation is performed may be distinguished from each other through the synchronizer. That is, since input/output signals TXD and DATA are transmitted and received at a high speed in a high-speed communication environment, an error may occur when the count circuit 140 receives and identifies the count enable signal CNT_EN and the output signal DATA. Therefore, errors may be prevented by dividing areas through the first synchronizer 143 and the second synchronizer 144.

However, the arrangement of the first synchronizer 143 and the second synchronizer 144 is not limited thereto. That is, the first synchronizer 143 and the second synchronizer 144 may be located outside the count circuit 140 and receive and output the count enable signal CNT_EN and the output signal DATA, respectively, according to the counter clock CLK.

Referring to FIGS. 3 and 8C, in some embodiments the count circuit 140 may further include a second counter 146, a second comparator 147, and a third logic gate 148. The first counter 141 may receive the count enable signal CNT_EN and the output signal DATA, according to the counter clock CLK, and output the first count value CNT1 by counting a section in which the value of the output signal DATA is constant according to the counter clock CLK as described above. The first comparator 142 may compare the first count value CNT1 to the threshold value Th and output a first comparison signal C1. For example, the first comparator 142 may output an activated first comparison signal C1 when the first count value CNT1 exceeds the threshold value Th and output a deactivated first comparison signal C1 when the first count value CNT1 is less than or equal to the threshold value Th.

The second counter 146 receives the count enable signal CNT_EN and receives the output signal DATA through a NOT operation to output the second count value CNT2 through the count operation as described above according to the counter clock CLK. Specifically, the second counter 146 may receive a signal having a level complementary to that of the output signal DATA received by the first counter 141 through a NOT operation. Therefore, for example, when the first counter 141 counts a section in which the value of the output signal DATA is constant at the logic low level as described above with reference to FIG. 4, the second counter 146 may count a section in which the output signal DATA has a constant logic high level. As such, the count circuit 140 may count both a section in which the value of the output signal DATA is constant at the logic low level and a section in which the value of the output signal DATA is constant at the logic high level through the additional arrangement of the second counter 146. That is, as described above, when the transmission of the input signal TXD is completed, there may be a section (e.g., an idle (IDLE) section) in which the differential signal is maintained constant, and the count circuit 140 may count a section in which the value of the output signal DATA is maintained constant at a logic high level because the first signal D+ is maintained at a logic high level and the second signal D− is maintained at a logic low level in addition to a section in which the first signal D+ is maintained at a logic low level and the second signal D− is maintained at a logic high level after entering an idle section such that the value of the output signal DATA is maintained constant at a logic low level.

Also, the second comparator 147 may compare the second count value CNT2 to the threshold value Th and output a second comparison signal C2. For example, the second comparator 147 may output an activated second comparison signal C2 when the second count value CNT2 exceeds the threshold value Th and output the deactivated second comparison signal C2 when the second count value CNT2 is less than or equal to the threshold value Th.

In some embodiments, the third logic gate 148 may receive the first comparison signal C1 and the second comparison signal C2 and output a reset signal RESET through an OR operation. Specifically, the third logic gate 148 may output an activated reset signal RESET when at least one of the first comparison signal C1 and the second comparison signal C2 is activated. That is, when at least one of the first count value CNT1 and the second count value CNT2 exceeds the threshold value Th, since the comparator receiving the count value exceeding the threshold value Th among the first comparator 142 and the second comparator 147 outputs an activated comparison signal, the third logic gate 148 may output an activated reset signal RESET through an OR operation of the first comparison signal C1 and the second comparison signal C2.

As a result, as described above, since both the section in which the value of the output signal DATA based on the differential signal is maintained at the logic low level and the section in which the value is maintained at the logic high level may be counted in the IDLE section after the transmission of the input signal TXD is completed, when the transmission of the input signal TXD is completed, regardless of which logic level the differential signal enters the IDLE section, the count circuit 140 may accurately detect whether transmission of the input signal TXD is completed by counting a section in which the value of the output signal DATA is constant.

Figure 9:
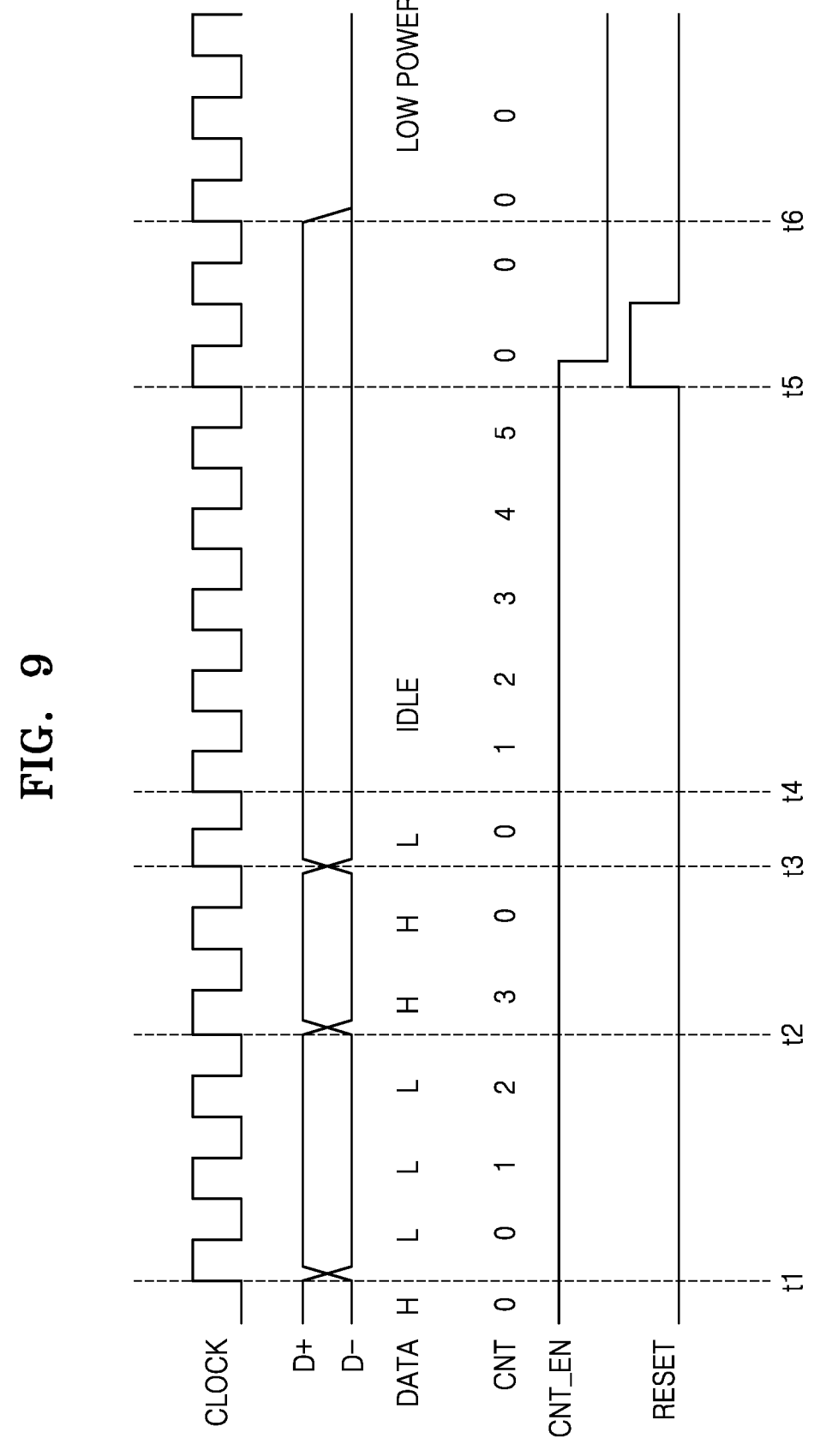
FIGS. 9 and 10 are timing diagrams for explaining an operation of a receiving device according to an embodiment of the present disclosure.
Figure 10:
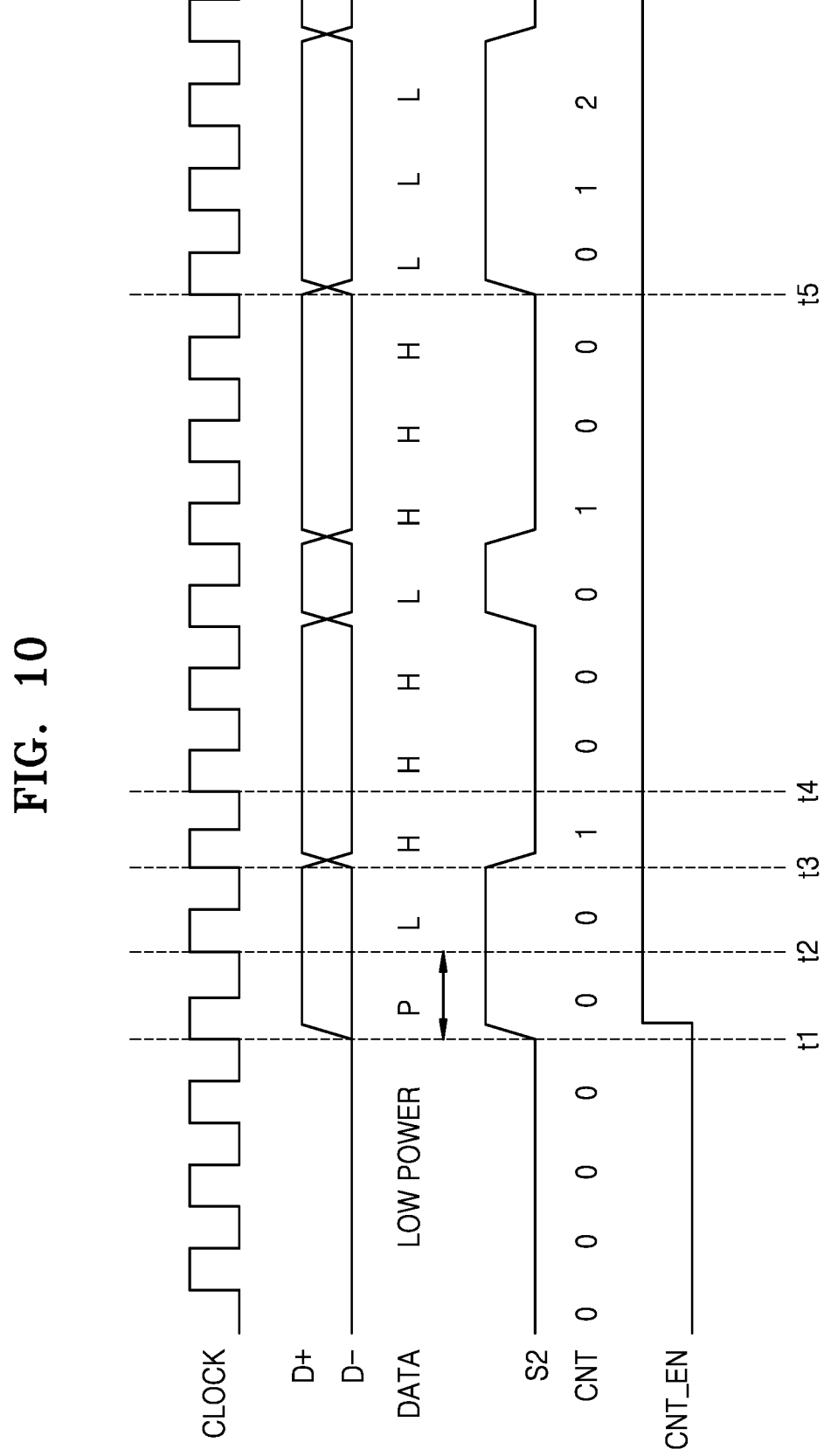

FIGS. 9 and 10 are timing diagrams for explaining an operation of a receiving device according to an embodiment of the present disclosure.

Examples of various signals shown in FIGS. 2, 6 and 8A will be described with reference to FIG. 9. The count operation of this timing diagram may count a section in which the value of the output signal DATA is maintained at a logic low level. Also, in this timing diagram, the threshold value Th may be set to 4. However, as described above, the disclosure is not limited to this embodiment. For example, the count operation may count a section in which the value of the output signal DATA is maintained at a logic high level and the threshold value Th may be set in various ways.

FIG. 9 shows an example in which a differential signal composed of a first signal D+ and a second signal D− is transmitted and enters an idle section and a low power mode.

Before t1, since the first signal D+ is at the logic high level and the second signal D− is at the logic low level, the value of the output signal DATA is at the logic high level. At t1, the value of the output signal DATA is changed to a logic low level and, thus, the count value CNT is increased by 1 by the positive edge of the next clock CLOCK. Since the value of the output signal DATA is maintained at the logic low level until after t2, the count value CNT increases by 1 with each subsequent positive edge of the clock CLOCK and becomes 3 at t2. After t2, the value of the output signal DATA changes to a logic high level and, accordingly, the count value CNT is reset to 0 by the positive edge of the clock CLOCK following t2. At t3, the value of the output signal DATA is changed to a logic low level. At t4, the transmission of the input signal TXD is completed and the idle section IDLE in which the differential signal is kept constant begins. Since the value of the output signal DATA immediately before t4 is at the logic low level, the count value CNT is increased by 1 based on the positive edge of the clock CLOCK at t4.

After that, since the value of the differential signal D+, D− is kept constant during the idle section IDLE, the count value CNT continuously increases by 1 with each positive edge of the clock CLOCK to reach a value of 5 before t5. At this time, since the count value CNT exceeds the threshold value Th of 4, the first comparator 142 may output an activated reset signal RESET. In some embodiments, the edge detector 145 may receive an activated reset signal RESET and output a pulse waveform reset signal RESET. Based on the reset signal RESET activated by the positive edge of the clock CLOCK at t5, the first counter 141 resets the count value CNT to 0. Also, based on the activated reset signal RESET, the flip-flop 132 may output a deactivated (i.e., logic low level) count enable signal CNT_EN. Accordingly, as described above, in response to the deactivated count enable signal CNT_EN, the gate circuit 140 may block the output of the output signal DATA and the count circuit 140 may stop counting.

As described above, through the idle section after t4, since the receiving device 102 may detect the completion of transmission of the input signal TXD and stop operation, the transmitting device 101 may enter the low power mode at t6 after sufficient idle sections. When entering the low power mode, by setting both the first signal D+ and the second signal D− to a logic low level, the transmitting device 101 may prevent current from flowing through the resistor R1 and the resistor R2 of the receiving device 102. Through this, it is possible to have an effect of greatly reducing unnecessary power consumption through an idle section and a low power mode.

Examples of various signals shown in FIGS. 5, 6 and 8A will be described with reference to FIG. 10. FIG. 10 shows an example in which transmission of the input signal TXD starts in the low power mode. In some embodiments, the second amplifier 122 may output a second amplifying signal S2 by comparing the second signal D−, rather than the first signal D+ illustrated in FIG. 5, with the reference voltage Vref.

The low power mode continues until t1, and transmission of the input signal TXD starts at t1. At this time, in some embodiments, a preamble section P may exist to allow time for various circuits of the receiving device 102 to exit the low power mode and operate. At t1, the second signal D− may be changed to a logic high level. The second amplifier 122 may output a second amplifying signal S2 having a logic high level by comparing the second signal D− changed to a logic high level with the reference voltage Vref. That is, the receiving device 102 may start the preamble section P by detecting the start of transmission of the input signal TXD. In addition, in response to the second amplifying signal S2 having a logic high level, the flip-flop 132 may output an activated count enable signal CNT_EN. Through this, the first counter 141 may receive the activated count enable signal CNT_EN and may enter a state in which the first counter 141 may perform a count operation.

After t2, since the first signal D+ is at the logic low level and the second signal D− is at the logic high level, the value of the output signal DATA becomes the logic low level. Since the value of the output signal DATA is at the logic low level right before t3, the count value CNT increases by 1 at t3 by the positive edge of the clock. In addition, since the first signal D+ changes to a logic high level and the second signal D− changes to a logic low level after t3, the second amplifier 122 compares the second signal D− changed to a logic low level with the reference voltage Vref and outputs a second amplifying signal S2 having a logic low level. Similarly, after t3, since the first signal D+ is changed to the logic high level and the second signal D− is changed to the logic low level, the value of the output signal DATA is changed to the logic high level. Since the value of the output signal DATA is at the logic high level right before t4, the count value CNT is reset to 0 by the positive edge of the clock at t4. After that, since the value of the output signal DATA is at the logic high level just before t5, the count value CNT is reset to 0 by the positive edge of the clock at t5. After t5, the value of the output signal DATA changes to a logic low level and the count value CNT increases by 1 due to the positive edge of the clock after t5.

Figure 11:
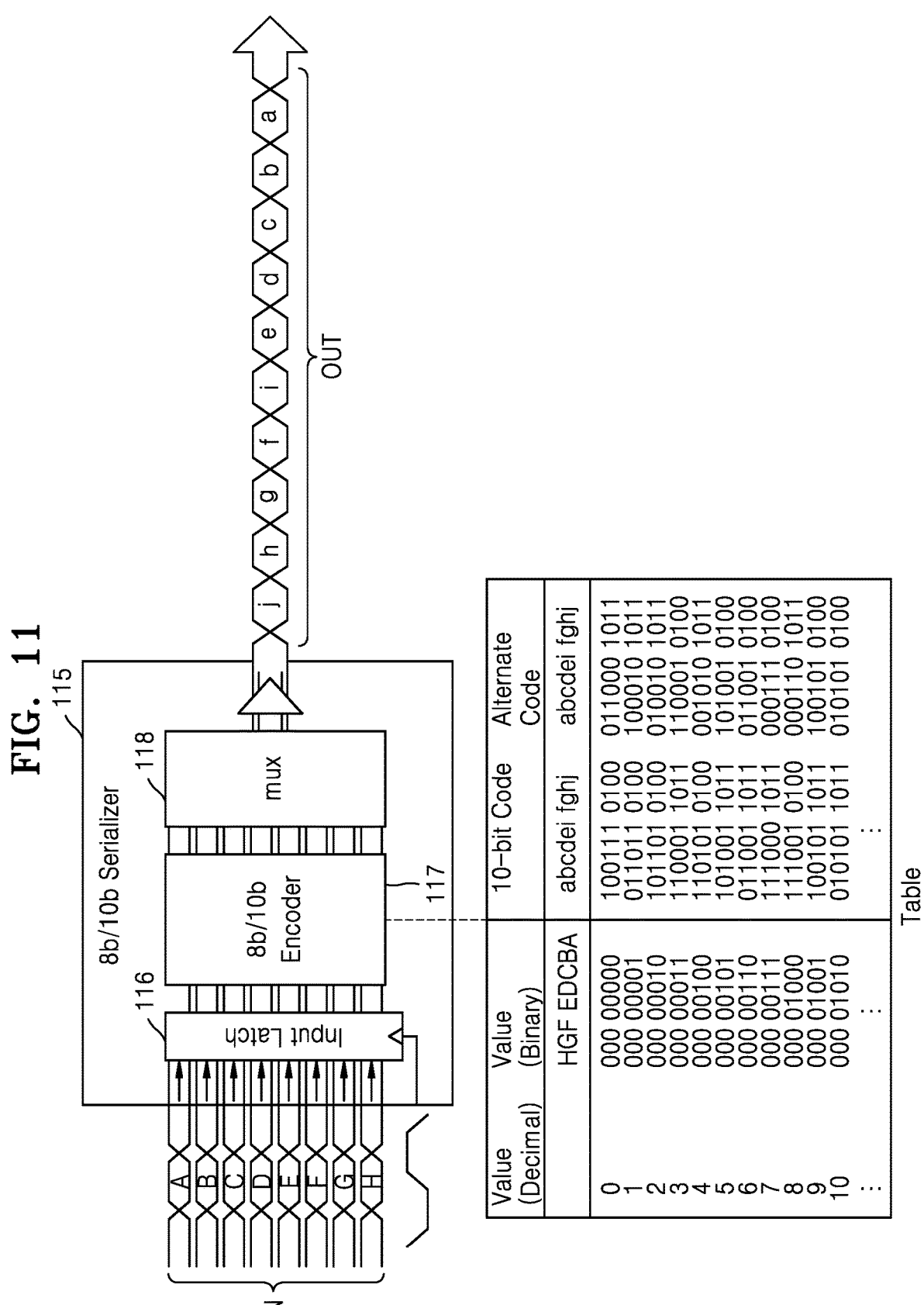
FIG. 11 is a diagram for conceptually explaining a signal encoding process according to an embodiment of the present disclosure.

FIG. 11 is a diagram for conceptually explaining a signal encoding process according to an embodiment of the present disclosure.

Referring to FIGS. 1 and 11, in some embodiments encoding may be performed so that the communication system 100 more accurately outputs the input signal TXD as an output signal DATA. For encoding, for example, the transmitting device 101 of FIG. 1 may further include a serializer. For example, the serializer may be an 8b/10b serializer 115 that receives 8-bit input data IN and converts the 8-bit input data IN to 10-bit output data OUT. The 8b/10b serializer 115 may include an input latch 116, an 8b/10b encoder 117, and a multiplexer (MUX) 118. The input latch 116 may receive, store, and output 8-bit input data IN to the 8b/10b encoder 117. The 8b/10b encoder 117 may receive the output of the input latch 116 and perform encoding. An encoding operation of converting 8-bit input data IN may be performed based on a mapping table as shown in the Table. The MUX 118 may receive the data converted by the 8b/10b encoder 117 and output the received data serially as shown to generate output data OUT. As a result, the 8b/10b serializer 115 may receive parallel input data IN and output the parallel input data IN as serial output data OUT.

Through this, the differential signal composed of the first signal D+ and the second signal D− may be toggled at least once within a certain period. For example, if the value of the differential signal based on the input signal TXD is maintained as one value for a long period of time, it may be difficult to restore the differential signal to an accurate output signal DATA. Accordingly, the transmitting device 101 encodes the input signal TXD through the 8b/10b serializer 115 to serialize data and may allow at least one bit of 10 bits to have a different value. That is, the transmitting device 101 may cause the output signal DATA to toggle from a logic high level to a logic low level or from a logic low level to a logic high level at least once in a certain period through a serializer and, through this, it is possible to have an effect of accurately restoring the input signal TXD to the output signal DATA. However, the disclosure is not limited to this embodiment. For example, encoding that performs data serialization may be performed by a serializer other than a serializer that encodes an 8-bit signal into a 10-bit signal.

Figure 12:
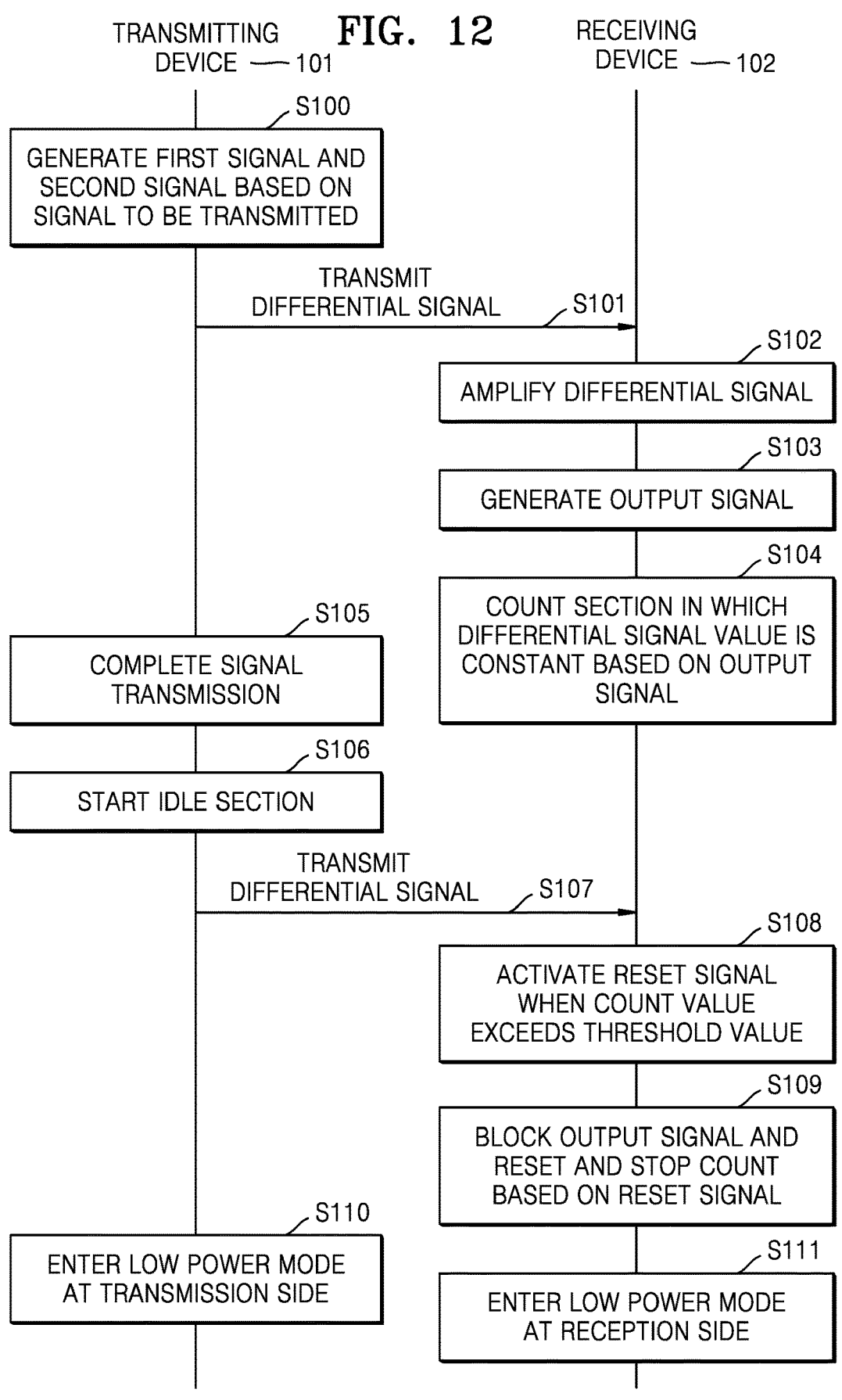
FIG. 12 is a flowchart generally illustrating a communication method according to an embodiment of the present disclosure.

FIG. 12 is a flowchart generally illustrating a communication method according to an embodiment of the present disclosure.

Referring to FIGS. 1 to 8C and 12, in some embodiments a transmitting device 101 may receive an input signal TXD, which is a signal to be transmitted, from the outside. The transmitting device 101 may generate the first signal D+ and the second signal D− through the aforementioned internal operation based on the input signal TXD in S100. The first signal D+ and the second signal D− may be generated as signals having complementary levels or signals having the same level according to the input signal TXD and the operation of the transmitting device 101. The transmitting device 101 may transmit a differential signal composed of the first signal D+ and the second signal D− to the receiving device 102 in S101. Hereinafter, the receiving device 102 may not only receive a signal provided from the outside, such as the transmitting device 101, but also internally transmit and receive signals generated (or output) internally through components.

The receiving device 102 may receive the differential signal transmitted from the transmitting device 101 and amplify the differential signal through the first amplifier 121 in S102. Also, in some embodiments, the receiving device 102 may detect whether the differential signal toggles (or transitions) through the second amplifier 122. The receiving device 102 may generate and produce an output signal DATA based on whether the differential signal is toggled and the amplified differential signal in S103. The output signal DATA based on the differential signal may be transmitted to the first counter 141. The receiving device 102 may count the section in which the value of the output signal DATA is constant through the first counter 141 as described below in S104, and it is possible to determine whether transmission of the input signal TXD is completed through the count operation.

Since the transmitting device 101 may determine whether or not the input signal TXD is transmitted, when the transmission of the input signal TXD is completed in S105, an idle section in which the logic levels of the first signal D+ and the second signal D− are maintained may be started in S106. As described above, the transmitting device 101 may transmit a differential signal having a constant logic level in S107. For example, a section in which the first signal D+ is maintained at a logic low level and the second signal D− is maintained at a logic high level so that the value of the output signal DATA is maintained constant at a logic low level or a section in which the first signal D+ is maintained at a logic high level and the second signal D− is maintained at a logic low level so that the value of the output signal DATA is maintained constant at a logic high level may start.

Since the receiving device 102 counts a section in which the value of the output signal DATA is constant, when the value of the differential signal is maintained constant due to the start of an idle section, the count value CNT may increase. When the count value CNT increases and exceeds the threshold value Th, the reset signal RESET may be activated (e.g., changed to a logic high level) in S108. In response to the activated reset signal RESET, the count value CNT may be reset and output of the amplified differential signal as the output signal DATA may be blocked in S109. Also, the counting operation may be stopped based on the activated reset signal RESET in S109. That is, the receiving device 102 may determine whether the transmission of the input signal TXD has ended and the idle section has started through whether the count value CNT exceeds the threshold value Th and block the output and stop the counting operation upon detecting the end of transmission of the input signal TXD.

After enough idle sections, the transmitting device 101 may enter the low power mode by, for example, setting both the first signal D+ and the second signal D− to a logic low level in S110. That is, the transmitting device 101 may adjust the first signal D+ and the second signal D− to enter the low power mode when transmission of the input signal TXD is completed. Because of this, since current does not flow through the resistor R1 and the resistor R2 of the receiving device 102, the receiving device 102 may enter a low power mode to reduce unnecessary power consumption in S111.

FIG. 13 is a flowchart illustrating a method of blocking output in a communication method according to an embodiment of the present disclosure.

Referring to FIGS. 1 to 8C and 13, as described above, the receiving device 102 may receive a differential signal based on the input signal TXD in S200 and amplify the received differential signal to generate a first amplifying signal S1 in S201. In some embodiments, the receiving device 102 may receive the first amplifying signal S1 and the reset signal RESET to gate the output of the output signal DATA. For example, when the deactivated reset signal RESET is received in S202, the first amplifying signal S1 based on the differential signal may be generated as an output signal DATA in S203. The first counter 141 may receive the output signal DATA and count a section having a constant value of the output signal DATA in S204. When the count value CNT does not exceed the threshold value Th in S205, the first counter 141 may receive the output signal DATA and continue the counting operation in S203 and S204. When the count value CNT exceeds the threshold value Th in S205, the reset signal RESET may be activated in S206. When the reset signal RESET is activated in S206, the receiving device 102 receives the activated reset signal RESET in S202 and blocks the first amplifying signal S1 from being produced as the output signal DATA in S207. As a result, the receiving device 102 may perform a gating operation of outputting or blocking the output signal DATA based on whether the first amplifying signal S1 and the reset signal RESET are activated. Through this, unnecessary signals may be prevented from being output and power consumption may be reduced.

Figure 14:
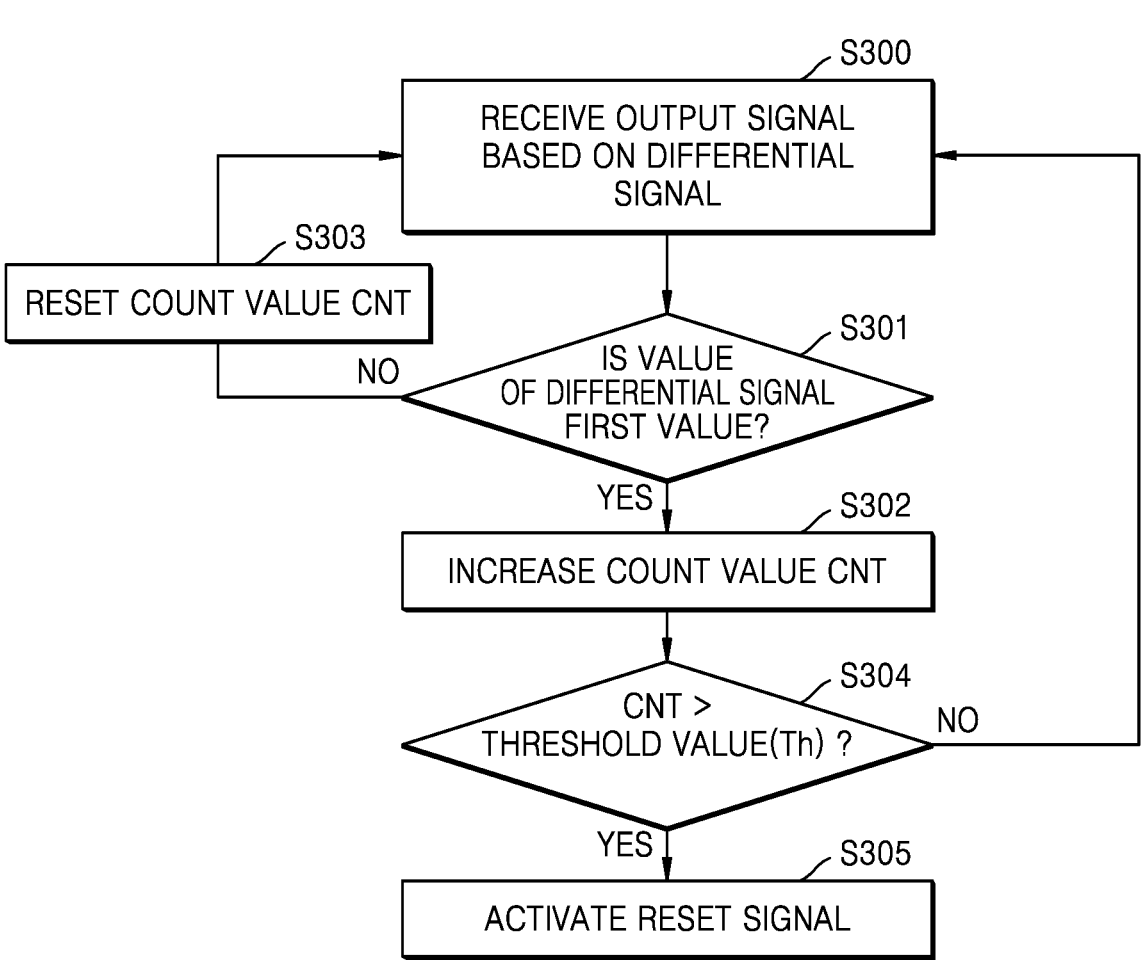
FIG. 14 is a flowchart illustrating a counting method of a communication method according to an embodiment of the present disclosure.

FIG. 14 is a flowchart illustrating a counting method of a communication method according to an embodiment of the present disclosure.

Referring to FIGS. 1 to 8C and 14, as described above, the first counter 141 may receive the output signal DATA based on the differential signal in S300. In some embodiments, the first counter 141 may count a section in which the value of the output signal DATA is a logic low level. However, the disclosure is not limited to this embodiment. For example, as described above, the first counter 141 may count a section in which the value of the output signal DATA is a logic high level.

The first counter 141 may determine whether the value of the differential signal has a first value (e.g., a logic low level) through the output signal DATA in S301. When the value of the differential signal is not the first value, since the output signal DATA is not a section in which the first value is maintained, the count value CNT may be reset (e.g., reset to 0) in S303. When the value of the differential signal is the first value, the count value CNT may be increased by 1 in conjunction with a clock signal in S302. As a result of the count operation, the receiving device 102 may determine whether the count value CNT exceeds the threshold value Th in S304. When the count value CNT does not exceed the threshold value Th, the receiving device 102 may continue the counting operation by receiving the output signal DATA in S300, S301, S302, and S303. When the count value CNT exceeds the threshold value Th, as described above, since the transmission of the input signal TXD has ended and the idle section has started, the reset signal RESET may be activated to block the output of the output signal DATA and stop the count operation in S305. As a result, the receiving device 102 may accurately determine whether or not transmission of the input signal TXD is completed through a counting operation.

Figure 15:
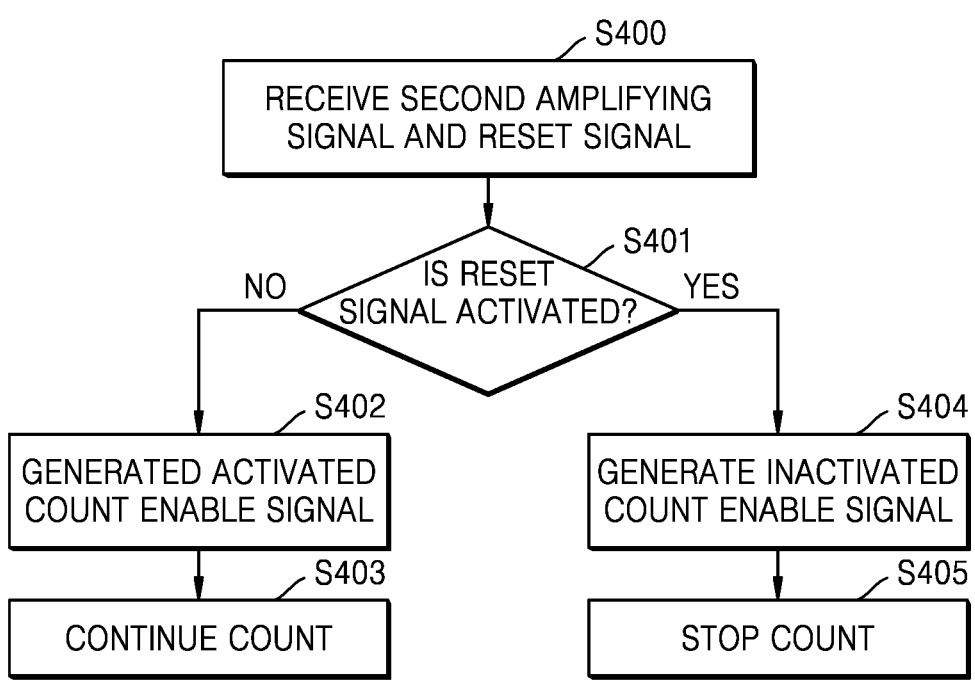
FIG. 15 is a flowchart illustrating a count control method of a communication method according to an embodiment of the present disclosure.

FIG. 15 is a flowchart illustrating a count control method of a communication method according to an embodiment of the present disclosure.

Referring to FIGS. 1 to 8C and 15, the receiving device 102 may receive the second amplifying signal S2 obtained by comparing at least one of the first signal D+ and the second signal D– with the reference voltage Vref in S400. That is, whether or not the input signal TXD toggles may be detected through the second amplifying signal S2. In addition, the receiving device 102 may receive the reset signal RESET according to the result of the count operation as described above in S400 and may determine whether the reset signal RESET is activated in S401. As described above, since the activation of the reset signal RESET is determined depending on whether the transmission of the input signal TXD is completed, if the reset signal RESET is a deactivated signal, as it is necessary to continuously determine whether the transmission of the input signal TXD is complete, the receiving device 102 may generate an activated count enable signal CNT_EN in S402 to continue the counting operation in S403. If the reset signal RESET is an activated signal, this indicates that the transmission of the input signal TXD has been completed and the idle section has started such that the receiving device 102 may generate a deactivated count enable signal CNT_EN in S404 to stop the counting operation in S405. Through this, it is possible to prevent an unnecessary counting operation from being performed, thereby reducing power consumption.

Figure 16:
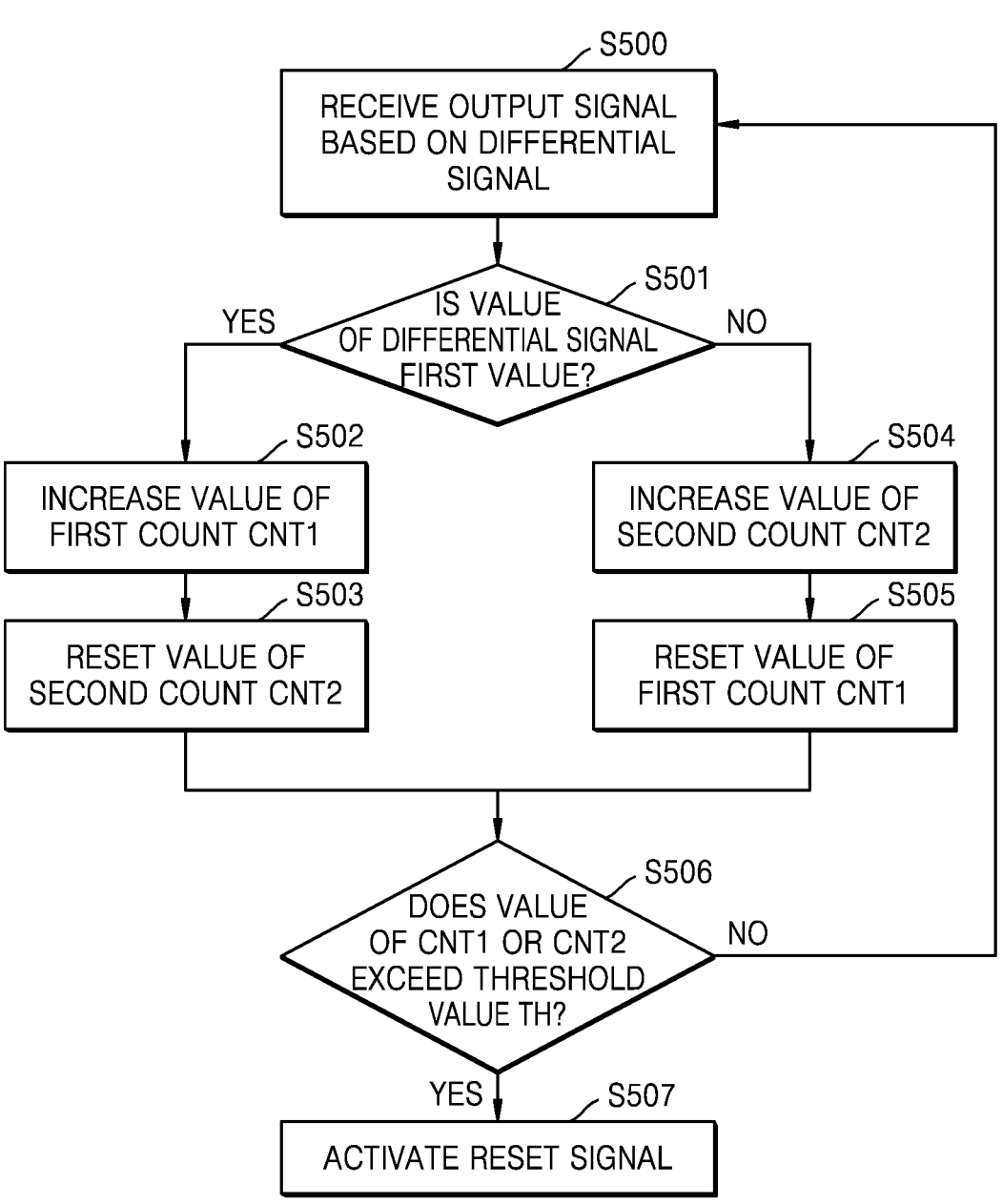
FIG. 16 is a flowchart illustrating a counting method of a communication method according to another embodiment of the present disclosure.

FIG. 16 is a flowchart illustrating a counting method of a communication method according to another embodiment of the present disclosure.

Referring to FIGS. 1 to 8C and 16, in some embodiments, the receiving device 102 may perform a counting operation through a first counter 141 and a second counter 146. Specifically, the first counter 141 may receive the output signal DATA in S500 and count sections in which the value of the output signal DATA is constant as the first value (e.g., a logic low level). In addition, the second counter 146 receives the output signal DATA in S500 and counts a section in which the value of the output signal DATA is constant as the second value (e.g., a logic high level).

When the value of the output signal DATA is the first value in S501, the first counter 141 may increase the first count value CNT1 in S502. Also, since the value of the output signal DATA is the first value and this does not correspond to a section in which the value of the output signal DATA is reset to the second value, the second counter 146 may reset the second count value CNT2 in S503. On the other hand, when the value of the output signal DATA is the second value in S501, the second counter 146 may increase the second count value CNT2 in S504. In addition, since the value of the output signal DATA is the second value and does not correspond to a section in which the value of the output signal DATA is reset to the first value, the first counter 141 may reset the first count value CNT1 in S505. That is, the receiving device 102 may count both a section in which the value of the output signal DATA is constant at a logic low level and a section in which the value of the output signal DATA is constant at a logic high level.

The receiving device 102 may determine whether the first count value CNT1 or the second count value CNT2 exceeds the threshold value Th in S506. If at least one of the first count value CNT1 and the second count value CNT2 exceeds the threshold value Th, since this refers to an idle section in which the transmission of the input signal TXD is completed and the value of the differential signal is maintained at a logic low level or a logic high level, the receiving device 102 may determine that transmission of the input signal TXD is completed. Therefore, the receiving device 102 may continue the count operation by receiving the output signal DATA in S500 to S505 when at least one of the first count value CNT1 and the second count value CNT2 does not exceed the threshold value Th and activate the reset signal RESET to cut off unnecessary output and stop the counting operation when at least one of the first count value CNT1 and the second count value CNT2 exceeds the threshold value Th in S507. Through this, unnecessary power consumption may be reduced.

Figure 17:
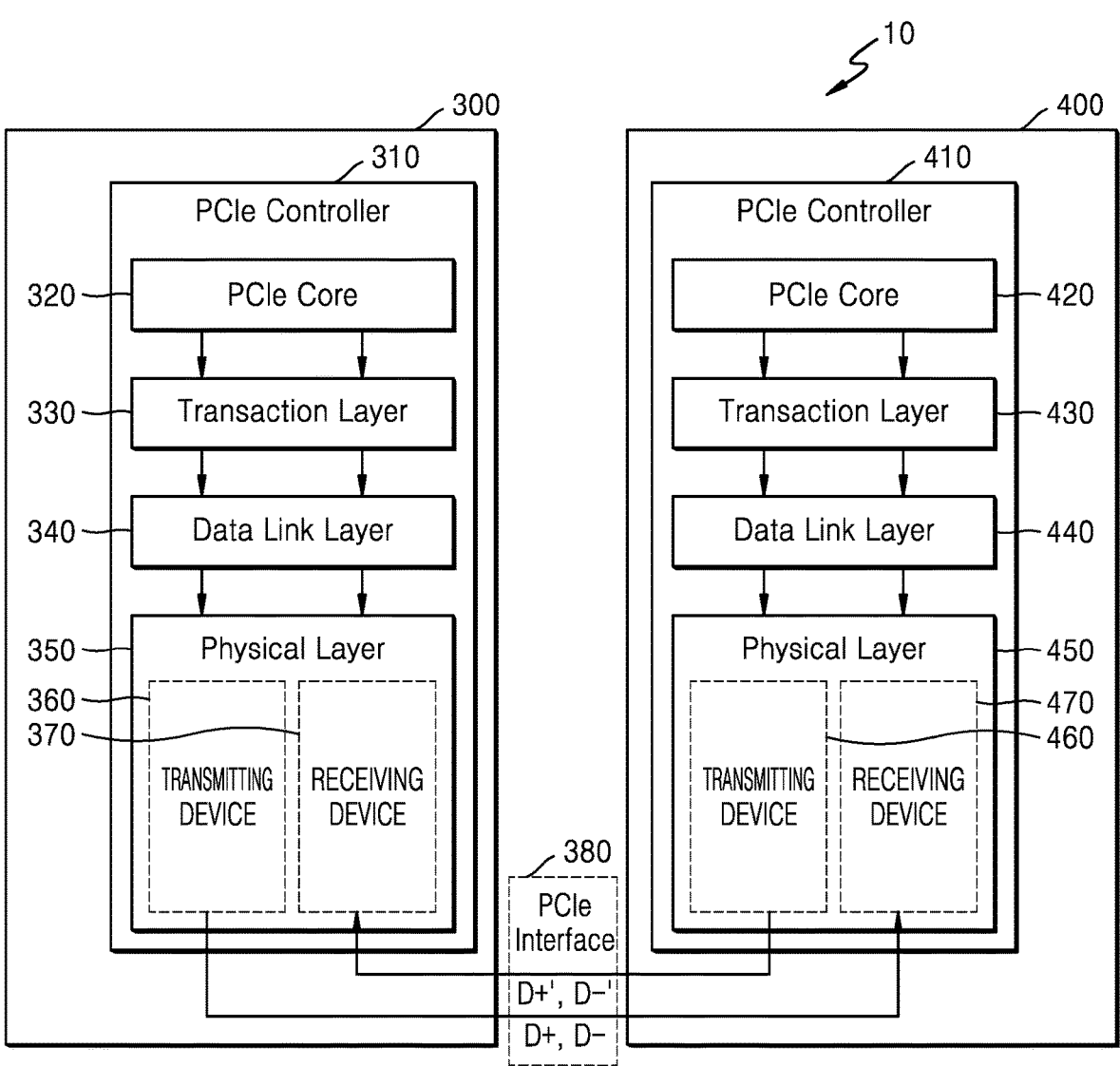
FIG. 17 is a block diagram showing a schematic configuration of a Peripheral Component Interconnect Express (PCIe) system to which an embodiment of the present disclosure is applied.

FIG. 17 is a block diagram showing a schematic configuration of a Peripheral Component Interconnect Express (PCIe) system to which an embodiment of the present disclosure is applied.

Referring to FIGS. 1 to 8C and 12 to 17, in some embodiments, the PCIe system 10 may include a PCIe host 300 and a PCIe device 400. The PCIe host 300 may refer to a computing device or a motherboard of the computing device capable of transmitting and receiving data to and from the PCIe device 400. A computing device may refer to a personal computer (PC), a laptop computer, or a mobile computing device. The PCIe device 400 may be connected to the PCIe host 300 through the PCIe interface 380. The PCIe device 400 may refer to an expansion card, an expansion board, an adapter card, an add-in card, or an accessory card, and each of these may refer to a printed circuit board (PCB) that may be inserted into an expansion slot or electrical connector on the motherboard of the PCIe host 300 to provide additional functionality to the PCIe system 10 via an expansion bus. Also, the PCIe device 400 may be a storage device such as a solid state drive (SSD) and may be a graphics card, a network card, or a USB card.

The PCIe host 300 may include a PCIe host controller 310. The PCIe host controller 310 may include a PCIe core 320, a transaction layer 330, a data link layer 340, and a physical layer 350. The PCIe device 400 may also include a PCIe device controller 410. The PCIe device controller 410 may include a PCIe core 420, a transaction layer 430, a data link layer 440, and a physical layer 450. PCIe layers may include three discrete logical layers, that is, the transaction layer 330 or 430, the data link layer 340 or 440, and the physical layer 350 or 450. Each layer, that is, the transaction layer 330 or 430, the data link layer 340 or 440, and the physical layer 350 or 450, may be divided into two sections. Transmitting devices 360 and 460 may process outbound (or to be transmitted) information, and receiving devices 370 and 470 may process inbound (or to be received) information. PCIe may use packets to communicate information between components, that is, the PCIe host 300 and the PCIe device 400.

An upper layer in the structure of the PCIe may be a transaction layer 330 or 430. The transaction layer 330 or 430 may aggregate and disassemble transaction layer packets (TLPs). TLPs may be used to perform transactions (read and write as well as other kinds of events).

The middle layer in the stack may be the data link layer 340 or 440, and the data link layer 340 or 440 may perform a function of an intermediate stage between the transaction layer 330 or 430 and the physical layer 350 or 450. The transmitting side of the data link layer 340 or 440 may accept TLPs aggregated at the transaction layer 330 or 430, calculate and apply data protection codes and TLP sequence numbers, and transmit the data protection code and TLP sequence number to the physical layer 350 or 450 for transmission over the PCIe interface 380.

In some embodiments, the physical layer 350 or 450 may include a transmitting device 360 or 460 and a receiving device 370 or 470 for an interface operation. In addition, although not shown in this drawing, the physical layer 350 or 450 includes a driver, an input buffer, a serial-to-parallel conversion circuit, a parallel-to-serial conversion circuit, a phase locked loop (PLL), and an impedance matching circuit. The physical layer 350 or 450 may also include logical functions related to interface initialization and maintenance.

The transmitting device 360 of the PCIe host 300 may transmit a differential signal composed of the first signal D+ and the second signal D− to the receiving device 470 of the PCIe device 400 based on the data that the PCIe host 300 transmits to the PCIe device 400. The receiving device 470 of the PCIe device 400 may receive and amplify the differential signal of the PCIe host 300. The receiving device 470 may produce an output signal based on the amplified signal, and determine whether transmission of the differential signal of the PCIe host 300 is terminated by counting a section in which the value of the output signal is constant, based on the output signal. When transmission of the differential signal of the PCIe host 300 is terminated, the receiving device 470 of the PCIe device 400 may block the output of the output signal and stop the counting operation.

In addition, the transmitting device 460 of the PCIe device 400 may transmit a differential signal composed of the third signal D+' and the fourth signal D−' to the receiving device 370 of the PCIe host 300 based on data to be transmitted from the PCIe device 400 to the PCIe host 300. As described above, the receiving device 370 of the PCIe host 300 may generate an amplified signal by receiving the differential signal of the PCIe device 400 and produce an output signal based on the amplified signal. The receiving device 370 may determine whether the transmission of the differential signal of the PCIe device 400 is finished by counting a section in which the value of the output signal is constant, and when transmission of the differential signal of the PCIe device 400 is terminated, the receiving device 370 of the PCIe host 300 may block the output of the output signal and stop the counting operation.

Figure 18:
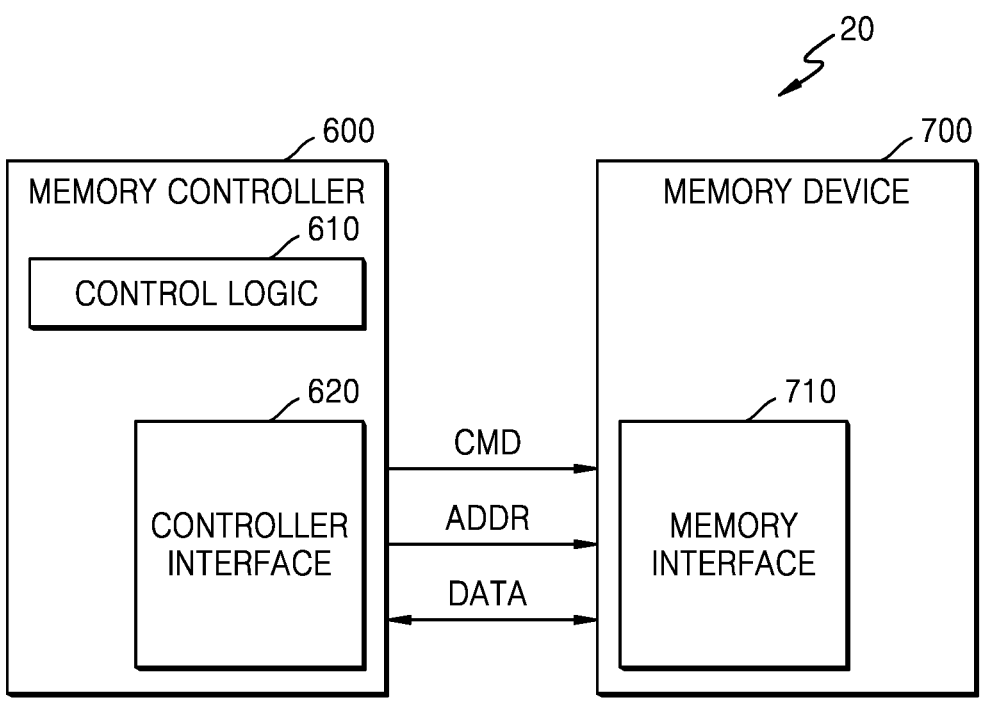
FIG. 18 is a block diagram illustrating a memory system to which an embodiment of the present disclosure is applied.

FIG. 18 is a block diagram illustrating a memory system to which an embodiment of the present disclosure is applied.

Semiconductor devices may perform various types of functions, and in performing the internal operation, various internal functions of the semiconductor device may be performed using a differential signal provided from the outside. According to embodiments, a semiconductor device may be various types of devices capable of controlling or accessing a memory device. As an example, the semiconductor device may be a memory controller or an application processor (AP), and the AP may be implemented as a system on chip (SoC). The AP may include a memory control module for controlling or accessing an internal or external memory device. Also, according to some embodiments, a semiconductor device may be a memory device including a memory cell array. For example, the semiconductor device may include dynamic random access memory (DRAM) such as Double Data Rate Synchronous Dynamic Random Access Memory (DDR SDRAM), Low Power Double Data Rate (LPDDR) SDRAM, Graphics Double Data Rate (GDDR) SDRAM, Rambus Dynamic Random Access Memory (RDRAM), or the like. Alternatively, the semiconductor device may be a non-volatile memory device such as flash memory. Also, according to embodiments, the semiconductor device may be various devices related to communication. For example, the semiconductor device may correspond to a modem chip that processes a baseband signal. Alternatively, the semiconductor device may be a ModAP in which a modem function is integrated into an AP.

As the various types of devices described above, a semiconductor device may receive a differential signal from the outside. In the following embodiments, it will be assumed that a semiconductor device corresponds to a memory controller, but embodiments of the disclosure may be applied to semiconductor devices capable of processing various types of differential signals.

Referring to FIGS. 1 to 8C, 12 to 16, and 18, a memory system 20 may include a memory controller 600 and a memory device 700 according to an embodiment of the disclosure. The memory controller 600 may include a control logic 610 and a controller interface 620, and the memory device 700 may include a memory interface 710. The memory controller 600 may provide various signals to the memory device 700 through the controller interface 620 to control memory operations such as writing and reading and transmit and receive data DATA (e.g., a differential signal composed of a first signal D+ and a second signal D−) between the controller interface 620 and the memory interface 710 of the memory device 700. For example, the memory controller 600 may provide a command CMD and an address ADDR for controlling a memory operation to the memory interface 710 of the memory device 700. The command CMD may include a command for a normal memory operation such as writing or reading data.

In some embodiments, the memory interface 710 may receive data DATA composed of a differential signal based on the first signal D+ and the second signal D− from the controller interface 620 according to the write operation command of the memory controller 600. After receiving and amplifying the differential signal provided from the controller interface 620, based on this, the memory interface 710 may produce first output data and transmit the first output data to a memory cell array (not shown) of the memory device 700. In addition, the memory interface 710 may count sections in which the value of the first output data is constant to determine whether transmission of the data DATA of the controller interface 620 has ended. When detecting an end of transmission of the data DATA, the memory interface 710 may block the output of the first output data and stop the counting operation.

In some embodiments, the controller interface 620 may receive data DATA composed of a differential signal based on the first signal D+ and the second signal D− from the memory interface 710 according to the read operation command of the memory controller 600. After receiving and amplifying the differential signal provided from the memory interface 710, based on this, the controller interface 620 may produce second output data and transmit the second output data to a buffer memory of the memory controller 600. In addition, the controller interface 620 may determine whether transmission of the data DATA of the memory interface 710 is terminated by counting a section in which the value of the second output data is constant. When detecting the end of data transmission, the controller interface 620 may block the output of the second output data and stop the counting operation.

In some embodiments, in various clock signals related to memory operations, to ensure the quality of the clock signal in high-speed operation, a data strobe signal (e.g., a differential signal composed of the first signal D+ and the second signal D−) corresponding to the differential signal may be provided to the memory controller 600. In the data read section where the data DATA is received, the first signal D+ and the second signal D− may correspond to signals having complementary levels or signals having the same level.

In some embodiments, a single-ended signal may be applied to transmitted and received data DATA. The memory controller 600 may latch the data DATA read from the memory device 700 in synchronization with a differential signal composed of the first signal D+ and the second signal D− and receive data DATA through the controller interface 620. In addition, to maximize data bandwidth per channel in data transmission and reception, memory write/read operations may be implemented with a half-duplex link. On-die termination (ODT) may be applied to a path through which the memory controller 600 receives the differential signal.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

While the disclosure has been particularly shown and described with reference to embodiments thereof, it will be understood that various changes in form and details may be made therein without departing from the spirit and scope of the following claims.

What is claimed is:

1. A device comprising:
a first device comprising a transmitting circuit configured to output and transmit a differential signal including a first signal and a second signal using an input signal and an enable signal; and
a second device comprising:
a first amplifier configured to receive the differential signal from the first device and output an amplified signal,
a gate circuit configured to gate the amplified signal of the first amplifier based on a reset signal, and
a count circuit configured to:
count a section in which a value of the differential signal indicated by an output signal of the gate circuit is constant based on a clock signal; and
generate an activated state of the reset signal when the section exceeds a threshold value.

2. The device of claim 1, wherein:
the count circuit comprises a first counter configured to count a section in which the differential signal has a first value, and
the first counter is configured to be reset when the differential signal has a second value.

3. The device of claim 2, further comprising:
a second amplifier configured to receive the first signal and a reference signal, wherein: the gate circuit is configured to generate a count enable signal based on the output signal of the second amplifier and the reset signal, and
the first counter is configured to stop counting in response to a deactivated state of the count enable signal.

4. The device of claim 3, wherein the gate circuit comprises:
a clock input to receive the output signal of the second amplifier, a reset input to receive the reset signal, and
a flip-flop configured to output the count enable signal.

5. The device of claim 4, wherein the gate circuit further comprises a logic gate configured to:
receive the output signal of the first amplifier, receive the count enable signal, and
generate the output signal of the gate circuit.

6. The device of claim 3, wherein:
the count circuit is configured to generate a first comparison signal that is activated when the value of the output signal of the first counter exceeds the threshold value, and
the count circuit comprises an edge detector configured to generate the reset signal by detecting an edge of the first comparison signal.

7. The device of claim 3, wherein the count circuit further comprises a synchronizer configured to synchronize with the clock signal a reception of each of the output signal and the count enable signal.

8. The device of claim 3, wherein:
the count circuit further comprises a second counter configured to count a section in which the differential signal has the second value, and
the second counter is configured to be reset when the differential signal has the first value.

9. The device of claim 8, wherein the count circuit is configured to generate:
a first comparison signal having an activated state when the output of the first counter exceeds the threshold value,
a second comparison signal having the activated state when the output of the second counter exceeds the threshold value, and
an activated state of the reset signal when at least one of the first comparison signal and the second comparison signal has the activated state.

10. The device of claim 3, wherein the transmitting circuit of the first device is configured to:
maintain a constant value of the differential signal during an idle section, transmit the differential signal to the second device, and
after the idle section, transmit the first signal and the second signal having the same potential, to enter a low power mode.

11. A method of communicating with a first device,
the method comprising: receiving a differential signal comprising a first signal and a second signal; generating a first amplified signal by amplifying the differential signal;
generating an output signal by gating the first amplified signal based on a reset signal; counting a section in which the differential signal indicated by the output signal has a constant value based on a clock signal; and
generating an activated state of the reset signal when the section exceeds a threshold value.

12. The method of claim 11, further comprising:
generating a second amplified signal by amplifying the first amplified signal and a reference signal;

generating a count enable signal based on the second amplified signal and the reset signal; and discontinuing counting of the section in response to the count enable signal having a deactivated state.

13. The method of claim 12, further comprising gating the first amplified signal, in response to receiving the count enable signal having an activated state, to generate the output signal.

14. The method of claim 12, further comprising synchronizing with the clock signal a reception of each of the output signal and the count enable signal.

15. The method of claim 11, wherein the counting of the section comprises: increasing a first count value when the differential signal has a first value; and resetting the first count value when the differential signal has a second value.

16. The method of claim 15, further comprising:

generating a comparison signal having an activated state when the first count value exceeds the threshold value; and generating the activated state of the reset signal in response to detecting an edge of the comparison signal.

17. The method of claim 15, wherein the counting of the section comprises: increasing a second count value when the differential signal is the second value; and resetting the second count value when the differential signal is the first value.

18. A method of communication between a first device and a second device, the method comprising:

transmitting, by the first device to the second device, a differential signal comprising a first signal and a second signal, wherein the first device:

transmits, to the second device, the differential signal having a constant value during an idle period, and enters a low power mode after the idle period;

counting, by the second device, a section in which a value of the differential signal is kept constant; and ignoring, by the second device, the value of the differential signal when the section exceeds a threshold value.

19. The method of claim 18, further comprising outputting, by the first device, the first signal and the second signal with the same potential in response to entering the low power mode.

20. The method of claim 18, further comprising:

increasing a count value when the differential signal has a first value; and resetting the count value when the differential signal has a second value; and discontinuing increasing the count value when the count exceeds the threshold value.

* * * * *